United States Patent

Lin et al.

(10) Patent No.: US 8,269,336 B2
(45) Date of Patent: Sep. 18, 2012

(54) SEMICONDUCTOR CHIP ASSEMBLY WITH POST/BASE HEAT SPREADER AND SIGNAL POST

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 288 days.

(21) Appl. No.: 12/642,795

(22) Filed: Dec. 19, 2009

(65) Prior Publication Data

US 2010/0096662 A1  Apr. 22, 2010

Related U.S. Application Data

(63) Continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, and a continuation-in-part of application No. 12/557,541, filed on Sep. 11, 2009, now Pat. No. 7,948,076, said application No. 12/616,775 is a continuation-in-part of application No. 12/557,540, and a continuation-in-part of application No. 12/557,541, said application No. 12/557,540 is a continuation-in-part of application No. 12/406,510, filed on Mar. 18, 2009, said application No. 12/557,541 is a continuation-in-part of application No. 12/406,510.

(60) Provisional application No. 61/257,830, filed on Nov. 3, 2009, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 23/34* (2006.01)

(52) U.S. Cl. ............... 257/698; 257/713; 257/E23.102; 257/E33.075

(58) Field of Classification Search .............. 257/693, 257/698, 700, 706, 713, E23.102, E33.075
See application file for complete search history.

(56) References Cited

U.S. PATENT DOCUMENTS

| | | | |
|---|---|---|---|
| 3,689,993 A | 9/1972 | Tolar | 438/380 |
| 3,969,199 A | 7/1976 | Berdan et al. | 205/177 |
| 4,420,767 A | 12/1983 | Hodge et al. | 257/713 |
| 4,509,096 A | 4/1985 | Baldwin et al. | 257/706 |
| 5,012,386 A | 4/1991 | McShane et al. | 361/386 |
| 5,102,829 A | 4/1992 | Cohn | 437/217 |

(Continued)

FOREIGN PATENT DOCUMENTS

JP  2005-166775  6/2005

*Primary Examiner* — Wensing Kuo
(74) *Attorney, Agent, or Firm* — Jackson IPG PLLC

(57) ABSTRACT

A semiconductor chip assembly includes a semiconductor device, a heat spreader, a conductive trace and an adhesive. The semiconductor device is electrically connected to the conductive trace and thermally connected to the heat spreader. The heat spreader includes a thermal post and a base. The thermal post extends upwardly from the base into a first opening in the adhesive, and the base extends laterally from the thermal post. The conductive trace includes a pad, a terminal and a signal post. The signal post extends upwardly from the terminal into a second opening in the adhesive.

60 Claims, 21 Drawing Sheets

U.S. PATENT DOCUMENTS

| | | | | |
|---|---|---|---|---|
| 5,379,187 | A | 1/1995 | Lee et al. | 361/707 |
| 5,457,605 | A | 10/1995 | Wagner et al. | 361/720 |
| 5,543,586 | A | 8/1996 | Crane, Jr. et al. | 174/262 |
| 5,644,163 | A | 7/1997 | Tsuji | 257/706 |
| 5,991,156 | A | 11/1999 | Bond et al. | 361/707 |
| 6,057,601 | A | 5/2000 | Lau et al. | 257/738 |
| 6,160,705 | A | 12/2000 | Stearns et al. | 361/704 |
| 6,162,664 | A | 12/2000 | Kim | 438/126 |
| 6,281,568 | B1 | 8/2001 | Glenn et al. | 257/684 |
| 6,313,525 | B1 | 11/2001 | Sasano | 257/704 |
| 6,453,549 | B1 | 9/2002 | Bhatt et al. | 29/837 |
| 6,495,914 | B1 | 12/2002 | Sekine et al. | 257/723 |
| 6,498,355 | B1 | 12/2002 | Harrah et al. | 257/99 |
| 6,507,102 | B2 | 1/2003 | Juskey et al. | 257/406 |
| 6,528,882 | B2 | 3/2003 | Ding et al. | 257/738 |
| 6,541,832 | B2 | 4/2003 | Coyle | 257/415 |
| 6,583,444 | B2 | 6/2003 | Fjelstad | 257/82 |
| 6,603,209 | B1 | 8/2003 | DiStefano et al. | 257/781 |
| 6,608,376 | B1 | 8/2003 | Liew et al. | 257/698 |
| 6,625,028 | B1 | 9/2003 | Dove et al. | 361/707 |
| 6,670,219 | B2 | 12/2003 | Lee et al. | 438/107 |
| 6,683,795 | B1 | 1/2004 | Yoo | 361/816 |
| 6,720,651 | B2 | 4/2004 | Gaku et al. | 257/707 |
| 6,744,135 | B2 | 6/2004 | Hasebe et al. | 257/712 |
| 6,861,750 | B2 | 3/2005 | Zhao et al. | 257/739 |
| 6,867,493 | B2 * | 3/2005 | Hashemi et al. | 257/717 |
| 6,900,535 | B2 | 5/2005 | Zhou | 257/707 |
| 6,906,414 | B2 | 6/2005 | Zhao et al. | 257/707 |
| 6,936,855 | B1 | 8/2005 | Harrah | 257/88 |
| 6,964,877 | B2 | 11/2005 | Chen et al. | 438/20 |
| 7,038,311 | B2 | 5/2006 | Woodall et al. | 257/706 |
| 7,109,573 | B2 * | 9/2006 | Nurminen | 257/675 |
| 7,196,403 | B2 | 3/2007 | Karim | 257/675 |
| 7,335,522 | B2 | 2/2008 | Wang et al. | 438/26 |
| 7,470,935 | B2 | 12/2008 | Lee et al. | 257/98 |
| 7,495,322 | B2 | 2/2009 | Hashimoto et al. | 257/676 |
| 7,582,951 | B2 | 9/2009 | Zhao et al. | 257/660 |
| 7,642,137 | B2 | 1/2010 | Lin et al. | 438/127 |
| 7,690,817 | B2 | 4/2010 | Sanpei et al. | 362/294 |
| 7,741,158 | B2 | 6/2010 | Leung et al. | 438/122 |
| 7,781,266 | B2 | 8/2010 | Zhao et al. | 438/123 |
| 7,808,087 | B2 | 10/2010 | Zhao et al. | 257/670 |
| 7,812,360 | B2 | 10/2010 | Yano | 257/98 |
| 7,956,372 | B2 | 6/2011 | Kamada et al. | 257/98 |
| 8,030,676 | B2 | 10/2011 | Lin | 257/99 |
| 8,071,998 | B2 | 12/2011 | Chen | 257/99 |
| 2003/0189830 | A1 | 10/2003 | Sugimoto et al. | 362/294 |
| 2004/0061433 | A1 | 4/2004 | Izuno et al. | 313/498 |
| 2004/0065894 | A1 | 4/2004 | Hashimoto et al. | 257/100 |
| 2005/0024834 | A1 | 2/2005 | Newby | 361/719 |
| 2005/0135105 | A1 | 6/2005 | Teixeira et al. | 362/294 |
| 2005/0185880 | A1 | 8/2005 | Asai | 385/14 |
| 2005/0274959 | A1 | 12/2005 | Kim et al. | 257/79 |
| 2006/0012967 | A1 | 1/2006 | Asai et al. | 361/764 |
| 2006/0054915 | A1 | 3/2006 | Chang | 257/100 |
| 2006/0109632 | A1 | 5/2006 | Berlin et al. | 361/719 |
| 2006/0131735 | A1 | 6/2006 | Ong et al. | 257/706 |
| 2007/0017815 | A1 * | 1/2007 | Wang et al. | 205/125 |
| 2007/0063213 | A1 | 3/2007 | Hsieh et al. | 257/99 |
| 2007/0077416 | A1 | 4/2007 | Ito et al. | 428/339 |
| 2007/0090522 | A1 | 4/2007 | Alhayek et al. | 257/723 |
| 2007/0252166 | A1 | 11/2007 | Chang et al. | 257/98 |
| 2007/0267642 | A1 | 11/2007 | Erchak et al. | 257/98 |
| 2007/0290322 | A1 | 12/2007 | Zhao et al. | 257/707 |
| 2008/0019133 | A1 | 1/2008 | Kim et al. | 362/294 |
| 2008/0099770 | A1 | 5/2008 | Mendendorp et al. | 257/79 |
| 2008/0102631 | A1 | 5/2008 | Andryushchenko et al. | 438/686 |
| 2008/0173884 | A1 | 7/2008 | Chitnis et al. | 257/98 |
| 2008/0180824 | A1 | 7/2008 | Endoh et al. | 359/894 |
| 2009/0309213 | A1 | 12/2009 | Takahashi et al. | 257/707 |
| 2010/0149756 | A1 | 6/2010 | Rowcliffe et al. | 361/714 |
| 2010/0291737 | A1 | 11/2010 | Ikeguchi et al. | 438/108 |
| 2011/0133204 | A1 | 6/2011 | Lai | 257/76 |

* cited by examiner

SEMICONDUCTOR CHIP ASSEMBLY WITH POST/BASE HEAT SPREADER AND SIGNAL POST

CROSS-REFERENCE TO RELATED APPLICATIONS

This application is a continuation-in-part of U.S. application Ser. No. 12/616,773 filed Nov. 11, 2009, now U.S. Pat. No. 8,067,784, which is incorporated by reference. This application is also a continuation-in-part of U.S. application Ser. No. 12/616,775 filed Nov. 11, 2009, which is incorporated by reference. This application also claims the benefit of U.S. Provisional Application Ser. No. 61/257,830 filed Nov. 3, 2009, which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The semiconductor device is electrically connected to the conductive trace and thermally connected to the heat spreader. The heat spreader includes a thermal post and a base. The thermal post extends upwardly from the base into a first opening in the adhesive, and the base extends laterally from the thermal post. The conductive trace includes a pad, a terminal and a signal post. The signal post extends upwardly from the terminal into a second opening in the adhesive.

In accordance with an aspect of the present invention, a semiconductor chip assembly includes a semiconductor device, an adhesive, a heat spreader and a conductive trace.

The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The conductive trace includes a pad, a terminal and a signal post, wherein the signal post extends below the pad and above the terminal and an electrically conductive path between the pad and the terminal includes the signal post.

The semiconductor device is above and overlaps the thermal post, is electrically connected to the pad and thereby electrically connected to the terminal, and is thermally connected to the thermal post and thereby thermally connected to the base. The adhesive is mounted on and extends above the base and extends laterally from the thermal post to or beyond the terminal. The pad extends above the adhesive and the terminal extends below the adhesive. The thermal post extends into the first opening and the signal post extends into the second opening. Furthermore, the posts have the same thickness and are coplanar with one another, and the base and the terminal have the same thickness and are coplanar with one another.

The conductive trace can include the pad, the terminal, the signal post and a routing line. The routing line can be adjacent to the pad, the signal post can be adjacent to the routing line and the terminal, extend below the pad and the routing line and extend above the terminal, the pad and the routing line can overlap the adhesive, the terminal can be overlapped by the adhesive, and the signal post can extend through the adhesive. The pad, the terminal, the signal post and the routing can contact the adhesive, and an electrically conductive path between the pad and the terminal can include the signal post and the routing line.

In accordance with another aspect of the present invention, a semiconductor chip assembly includes a semiconductor device, an adhesive, a heat spreader, a substrate and a conductive trace. The adhesive includes first and second openings. The heat spreader includes a thermal post and a base, wherein the thermal post is adjacent to the base and extends above the base in an upward direction, and the base extends below the thermal post in a downward direction opposite the upward direction and extends laterally from the thermal post in lateral directions orthogonal to the upward and downward directions. The substrate includes a pad and a dielectric layer, and first and second apertures extend through the substrate. The conductive trace includes the pad, a terminal and a signal post, wherein the signal post extends below the pad and above the terminal and an electrically conductive path between the pad and the terminal includes the signal post.

The semiconductor device is above and overlaps the thermal post, is electrically connected to the pad and thereby electrically connected to the terminal, and is thermally connected to the thermal post and thereby thermally connected to the base. The adhesive is mounted on and extends above the base, extends into a first gap in the first aperture between the thermal post and the substrate and into a second gap in the second aperture between the signal post and the substrate, extends across the dielectric layer in the gaps, extends laterally from the thermal post to or beyond the terminal and is sandwiched between the thermal post and the dielectric layer, between the signal post and the dielectric layer and between the base and the dielectric layer. The substrate is mounted on the adhesive and extends above the base. The thermal post extends into the first opening and the first aperture, and the signal post extends into the second opening and the second aperture. Furthermore, the posts have the same thickness and are coplanar with one another, and the base and the terminal have the same thickness and are coplanar with one another.

The heat spreader can include a cap that is above and adjacent to and covers in the upward direction and extends laterally in the lateral directions from a top of the thermal post. For instance, the cap can have a rectangular or square shape and the top of the thermal post can have a circular shape. In this instance, the cap can be sized and shaped to accommodate a thermal contact surface of the semiconductor device whereas the top of the thermal post is not sized and shaped to accommodate the thermal contact surface of the semiconductor device. The cap can also contact and cover a portion of the adhesive that is coplanar with and adjacent to the thermal post. The cap can also be coplanar with the pad above the dielectric layer. In addition, the thermal post can thermally connect the base and the cap. The heat spreader can consist of the thermal post and the base or the thermal post, the base and the cap. The heat spreader can also consist of copper, aluminum or copper/nickel/aluminum. In any case, the heat spreader provides heat dissipation and spreading from the semiconductor device to the next level assembly.

The semiconductor device can be mounted on the heat spreader. For instance, the semiconductor device can be mounted on the heat spreader and the substrate, overlap the thermal post and the pad, be electrically connected to the pad using a first solder joint and be thermally connected to the heat spreader using a second solder joint. Alternatively, the semiconductor device can be mounted on the heat spreader but not the substrate, overlap the thermal post but not the substrate, be electrically connected to the pad using a wire bond and be thermally connected to the heat spreader using a die attach.

The semiconductor device can be a packaged or unpackaged semiconductor chip. For instance, the semiconductor device can be an LED package that includes an LED chip, is mounted on the heat spreader and the substrate, overlaps the thermal post and the pad, is electrically connected to the pad using a first solder joint and is thermally connected to the heat spreader using a second solder joint. Alternatively, the semiconductor device can be a semiconductor chip that is mounted on the heat spreader but not the substrate, overlaps the thermal post but not the substrate, is electrically connected to the pad using a wire bond and is thermally connected to the heat spreader using a die attach.

The adhesive can contact the thermal post and the dielectric layer in the first gap, contact the signal post and the dielectric layer in the second gap and contact the base, the terminal and the dielectric layer outside the gaps. The adhesive can also cover and surround the posts in the lateral directions and conformally coat the sidewalls of the posts. The adhesive can also be coplanar with tops and bottoms of the posts.

The adhesive can extend laterally from the thermal post to or beyond the terminal. For instance, the adhesive and the terminal can extend to peripheral edges of the assembly. In this instance, the adhesive extends laterally from the thermal post to the terminal. Alternatively, the adhesive can extend to peripheral edges of the assembly and the terminal can be spaced from the peripheral edges of the assembly. In this instance, the adhesive extends laterally from the thermal post beyond the terminal.

The thermal post can be integral with the base. For instance, the thermal post and the base can be a single-piece metal or include a single-piece metal at their interface, and the single-piece metal can be copper. The thermal post can also extend through the first aperture. The thermal post can also be coplanar with the adhesive above the dielectric layer. The thermal post can also have a cut-off conical shape in which its diameter decreases as it extends upwardly from the base to its flat top adjacent to the cap.

The signal post can be integral with the terminal. For instance, the signal post and the terminal can be a single-piece metal or include a single-piece metal at their interface, and the single-piece metal can be copper. The signal post can also extend through the second aperture. The signal post can also be coplanar with the adhesive above the dielectric layer. The signal post can also have a cut-off conical shape in which its diameter decreases as it extends upwardly from the terminal to its flat top adjacent to the routing line.

The base can cover the thermal post in the downward direction, support the substrate and be spaced from peripheral edges of the assembly.

The substrate can be spaced from the thermal post and the base. The substrate can also be a laminated structure.

The conductive trace can be spaced from the heat spreader. The pad can contact the dielectric layer, the terminal can contact the adhesive and the signal post can contact the adhesive and the dielectric layer. Furthermore, the terminal can be adjacent to and extend below and laterally from the signal post.

The pad can be an electrical contact for the semiconductor device, the terminal can be an electrical contact for the next level assembly, and the pad and the terminal can provide vertical signal routing between the semiconductor device and the next level assembly.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a thermal post, a signal post and a base, mounting an adhesive on the base including inserting the thermal post into a first opening in the adhesive and the signal post into a second opening in the adhesive, mounting a conductive layer on the adhesive including aligning the thermal post with a first aperture in the conductive layer and the signal post with a second aperture in the conductive layer, then flowing the adhesive into and upward in a first gap located in the first aperture between the thermal post and the conductive layer and in a second gap located in the second aperture between the signal post and the conductive layer, solidifying the adhesive, then providing a conductive trace that includes a pad, a terminal, the signal post and a selected portion of the conductive layer, mounting a semiconductor device on a heat spreader that includes the thermal post and the base, electrically connecting the semiconductor device to the conductive trace and thermally connecting the semiconductor device to the heat spreader.

In accordance with an aspect of the present invention, a method of making a semiconductor chip assembly includes (1) providing a thermal post, a signal post, a base, an adhesive and a conductive layer, wherein (a) the thermal post is adjacent to the base, extends above the base in an upward direction, extends into a first opening in the adhesive and is aligned with a first aperture in the conductive layer, (b) the signal post is adjacent to the base, extends above the base in the upward direction, extends into a second opening in the adhesive and is aligned with a second aperture in the conductive layer, (c) the base extends below the posts in a downward direction opposite the upward direction and extends laterally from the posts in lateral directions orthogonal to the upward and downward directions, (d) the adhesive is mounted on and extends above the base, is sandwiched between the base and the conductive layer and is non-solidified, and (e) the conductive layer is mounted on and extends above the adhesive, then (2) flowing the adhesive into and upward in a first gap located in the first aperture between the thermal post and the conductive layer and in a second gap located in the second aperture between the signal post and the conductive layer, (3) solidifying the adhesive, then (4) providing a conductive trace that includes a pad, a terminal, the signal post and a selected portion of the conductive layer, (5) mounting a semiconductor device on a heat spreader that includes the thermal post and the base, wherein the semiconductor device overlaps the thermal post, (6) electrically connecting the semiconductor device to the pad, thereby electrically connecting the semiconductor device to the terminal, wherein an electrically conductive path between the pad and the terminal includes the signal post, and (7) thermally connecting the semiconductor device to the thermal post, thereby thermally connecting the semiconductor device to the base.

In accordance with another aspect of the present invention, a method of making a semiconductor chip assembly includes (1) providing a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions, (2) providing an adhesive, wherein first and second openings extend through the adhesive, (3) providing a conductive layer, wherein first and second apertures extend through the conductive layer, (4) mounting the adhesive on the base, including inserting the thermal post into the first opening and the signal post into the second opening, wherein the adhesive extends above the base, the thermal post extends into the first opening and the signal post extends into the second opening, (5) mounting the conductive layer on the adhesive, including aligning the thermal post with the first aperture and the signal post with the second aperture, wherein the conductive layer extends above the adhesive and the adhesive is sandwiched between the base and the conductive layer and is non-solidified, then (6) applying heat to melt the adhesive, (7) moving the base and the conductive layer towards one another, thereby moving the thermal post upward in the first aperture, moving the signal post upward in the second aperture and applying pressure to the molten adhesive between the base and the conductive layer, wherein the pressure forces the molten adhesive to flow into and upward in a first gap located in the first aperture between the thermal post and the conductive layer and in a second gap located in the second aperture between the signal post and the conductive layer, (8) applying heat to solidify the molten adhesive, thereby mechanically attaching the posts and the base to the conductive layer, then (9) providing a conductive trace that includes a pad, a terminal, a routing line and the signal post, wherein the conductive trace includes a selected portion of the conductive layer and an electrically conductive path between the pad and the terminal includes the routing line and the signal post, (10) mounting a semiconductor device on a heat spreader that includes the thermal post and the base, wherein the semiconductor device overlaps the thermal post, (11) electrically connecting the semiconductor device to the pad, thereby electrically connecting the semiconductor device to the terminal, and (12) thermally connecting the semiconductor device to the thermal post, thereby thermally connecting the semiconductor device to the base.

Mounting the conductive layer can include mounting the conductive layer alone on the adhesive, or alternatively, attaching the conductive layer to a carrier, then mounting the conductive layer and the carrier on the adhesive such that the carrier overlaps the conductive layer and the conductive layer contacts the adhesive and is sandwiched between the adhesive and the carrier, and then, after solidifying the adhesive, removing the carrier and then providing the conductive trace.

In accordance with another aspect of the present invention, a method of making a semiconductor chip assembly includes (1) providing a thermal post, a signal post, a base, an adhesive and a substrate, wherein (a) the substrate includes a conductive layer and a dielectric layer, (b) the thermal post is adjacent to the base, extends above the base in an upward direction, extends through a first opening in the adhesive and extends into a first aperture in the substrate, (c) the signal post is adjacent to the base, extends above the base in the upward direction, extends through a second opening in the adhesive and extends into a second aperture in the substrate, (d) the base extends below the posts in a downward direction opposite the upward direction and extends laterally from the posts in lateral directions orthogonal to the upward and downward directions, (e) the adhesive is mounted on and extends above the base, is sandwiched between the base and the substrate and is non-solidified, (f) the substrate is mounted on and extends above the adhesive and the conductive layer extends above the dielectric layer, (g) a first gap is located in the first aperture between the thermal post and the substrate, and (h) a second gap is located in the second aperture between the signal post and the substrate, then (2) flowing the adhesive into and upward in the gaps, (3) solidifying the adhesive, then (4) mounting a semiconductor device on a heat spreader that includes the thermal post and the base, wherein the semiconductor device overlaps the thermal post, a conductive trace includes a pad, a terminal, the signal post and a selected portion of the conductive layer and an electrically conductive path between the pad and the terminal includes the signal post, (5) electrically connecting the semiconductor device to the pad, thereby electrically connecting the semiconductor device to the terminal, and (6) thermally connecting the semiconductor device to the thermal post, thereby thermally connecting the semiconductor device to the base.

In accordance with another aspect of the present invention, a method of making a semiconductor chip assembly includes (1) providing a thermal post, a signal post and a base, wherein the thermal post is adjacent to and integral with the base and extends above the base in an upward direction, the signal post is adjacent to and integral with the base and extends above the base in the upward direction, and the base extends below the posts in a downward direction opposite the upward direction and extends laterally from the posts in lateral directions orthogonal to the upward and downward directions, (2) providing an adhesive, wherein first and second openings extend through the adhesive, (3) providing a substrate that includes a conductive layer and a dielectric layer, wherein first and second apertures extend through the substrate, (4) mounting the adhesive on the base, including inserting the thermal post through the first opening and the signal post through the second opening, wherein the adhesive extends above the base, the thermal post extends through the first opening and the signal post extends through the second opening, (5) mounting the substrate on the adhesive, including inserting the thermal post into the first aperture and the signal post into the second aperture, wherein the substrate extends above the adhesive, the conductive layer extends above the dielectric layer, the thermal post extends through the first opening into the first aperture, the signal post extends through the second opening into the second aperture, the adhesive is sandwiched between the base and the substrate and is non-solidified, a first gap is located in the first aperture between the thermal post and the substrate and a second gap is located in the second aperture between the signal post and the substrate, then (6) applying heat to melt the adhesive, (7) moving the base and the substrate towards one another, thereby moving the thermal post upward in the first aperture, moving the signal post upward in the second aperture and applying pressure to the molten adhesive between the base and the substrate, wherein the pressure forces the molten adhesive to flow into and upward in the gaps and the posts and the molten adhesive extend above the dielectric layer, (8) applying heat to solidify the molten adhesive, thereby mechanically attaching the posts and the base to the substrate, then (9) mounting a semiconductor device on a heat spreader that includes the thermal post and the base, wherein the semiconductor device overlaps the post, a conductive trace includes a pad, a terminal, the signal post and a selected portion of the conductive layer and an electrically conductive path between the pad and the terminal includes the signal post, (10) electrically connecting the semiconductor device to the pad, thereby electrically connecting the semiconductor device to the terminal, and (11) thermally connecting the semiconductor device to the thermal post, thereby thermally connecting the semiconductor device to the base.

Providing the thermal post, the signal post and the base can include providing a metal plate, forming an etch mask on the metal plate that selectively exposes the metal plate, etching the metal plate in a pattern defined by the etch mask, thereby forming a recess in the metal plate that extends into but not through the metal plate, and then removing the etch mask, wherein the thermal post includes a first unetched portion of the metal plate that protrudes above the base and is laterally surrounded by the recess, the signal post includes a second unetched portion of the metal plate that protrudes above the base and is laterally surrounded by the recess, and the base is an unetched portion of the metal plate below the posts and the recess.

Providing the adhesive can include providing a prepreg with uncured epoxy, flowing the adhesive can include melting the uncured epoxy and compressing the uncured epoxy between the base and the substrate, and solidifying the adhesive can include curing the molten uncured epoxy.

Providing the heat spreader can include providing a cap on the thermal post that is above and adjacent to and covers in the upward direction and extends laterally in the lateral directions from a top of the thermal post after solidifying the adhesive and before mounting the semiconductor device.

Providing the pad can include removing selected portions of the conductive layer after solidifying the adhesive.

Providing the pad can also include grinding the posts, the adhesive and the conductive layer after solidifying the adhesive such that the posts, the adhesive and the conductive layer are laterally aligned with one another at a top lateral surface that faces in the upward direction, and then removing selected portions of the conductive layer such that the pad includes selected portions of the conductive layer. The grinding can include grinding the adhesive without grinding the posts and then grinding the posts, the adhesive and the conductive layer. The removing can include applying a wet chemical etch to the conductive layer using an etch mask that defines the pad.

Providing the pad can also include depositing a second conductive layer on the posts, the adhesive and the conductive layer after the grinding and then removing selected portions of the conductive layers such that the pad includes selected portions of the conductive layers. Depositing the second conductive layer can include electrolessly plating a first plated layer on the posts, the adhesive and the conductive layer and then electroplating a second plated layer on the first plated layer. The removing can include applying the wet chemical etch to the conductive layers using the etch mask to define the pad.

Providing the terminal can include removing selected portions of the base after solidifying the adhesive. The removing can include applying a wet chemical etch to the base using an etch mask to define the terminal such that the terminal includes an unetched portion of the base that is adjacent to the signal post and is spaced and separated from and no longer part of the base. Thus, the pad and the terminal can be formed simultaneously using the same wet chemical etch and different etch masks.

Providing the cap can include removing selected portions of the second conductive layer. Providing the cap can also include the grinding and then removing selected portions of the second conductive layer using the etch mask to define the cap such that the cap includes selected portions of the second conductive layer. Thus, the pad and the cap can be formed simultaneously using the same grinding, wet chemical etch and etch mask.

Flowing the adhesive can include filling the gaps with the adhesive. Flowing the adhesive can also include squeezing the adhesive through the gaps, above the posts and the substrate and on top surface portions of the posts and the substrate adjacent to the gaps.

Solidifying the adhesive can include mechanically bonding the posts and the base to the substrate.

Mounting the semiconductor device can include mounting the semiconductor device on the cap. Mounting the semiconductor device can also include positioning the semiconductor device above and overlapping the thermal post, the cap, the first opening and the first aperture without overlapping the signal post, the second opening or the second aperture.

Mounting the semiconductor device can include providing a first solder joint between an LED package that includes an LED chip and the pad and a second solder joint between the LED package and the cap, electrically connecting the semiconductor device can include providing the first solder joint between the LED package and the pad, and thermally connecting the semiconductor device can include providing the second solder joint between the LED package and the cap.

Mounting the semiconductor device can include providing a die attach between a semiconductor chip and the cap, electrically connecting the semiconductor device can include providing a wire bond between the chip and the pad, and thermally connecting the semiconductor device can include providing the die attach between the chip and the cap.

The adhesive can contact the posts, the base, the cap and the dielectric layer, cover the substrate in the downward direction, cover and surround the posts in the lateral directions and extend to peripheral edges of the assembly after the assembly is manufactured and detached from other assemblies in a batch.

The base can cover the semiconductor device, the thermal post and the cap in the downward direction, support the substrate and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The thermal post and the base can be integral with one another, thereby enhancing reliability. The cap can be customized for the semiconductor device, thereby enhancing the thermal connection. The adhesive can be sandwiched between the posts and the substrate and between the base and the substrate, thereby providing a robust mechanical bond between the heat spreader and the substrate. The conductive trace can provide signal routing with simple circuitry patterns or flexible multi-layer signal routing with complex circuitry patterns. The conductive trace can also provide vertical signal routing between the pad above the dielectric layer and the terminal below the adhesive. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
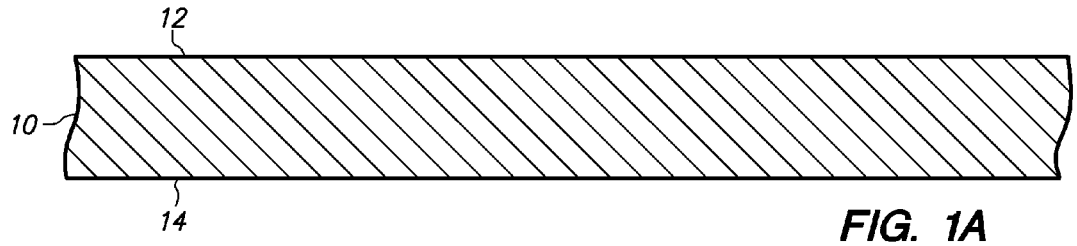
FIGS. 1A-1D are cross-sectional views showing a method of making a post and a base in accordance with an embodiment of the present invention.
Figure 1B:
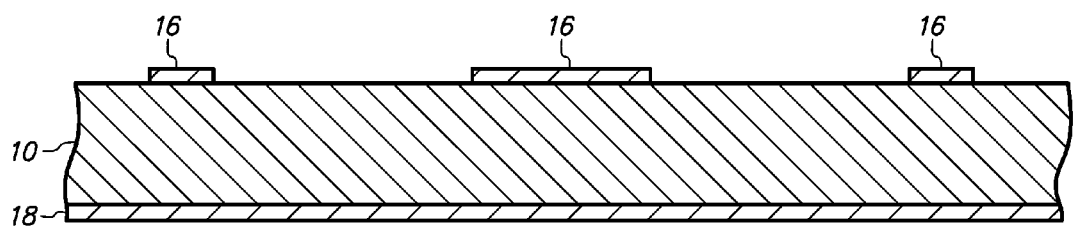
Figure 1C:
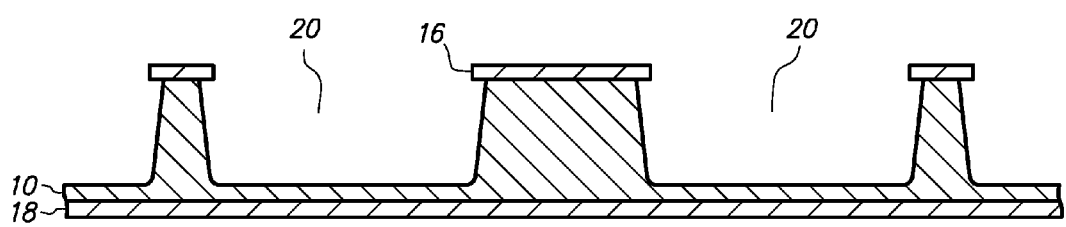
Figure 1D:
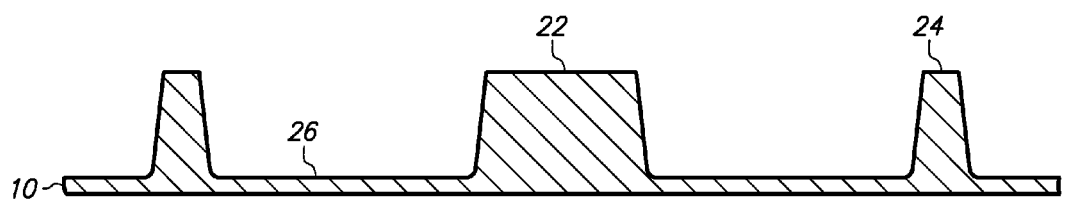
Figure 1E:
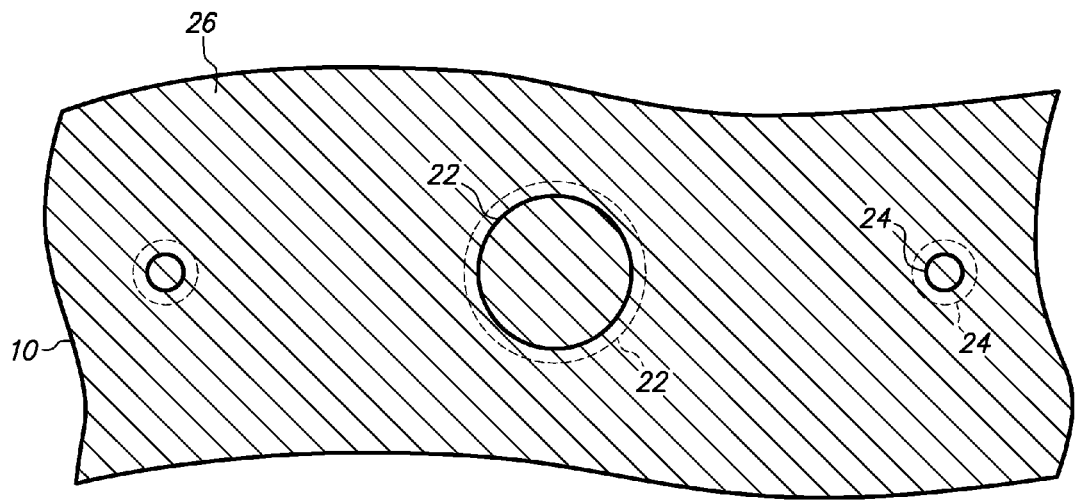
FIGS. 1E and 1F are top and bottom views, respectively, corresponding to FIG. 1D.
Figure 1F:
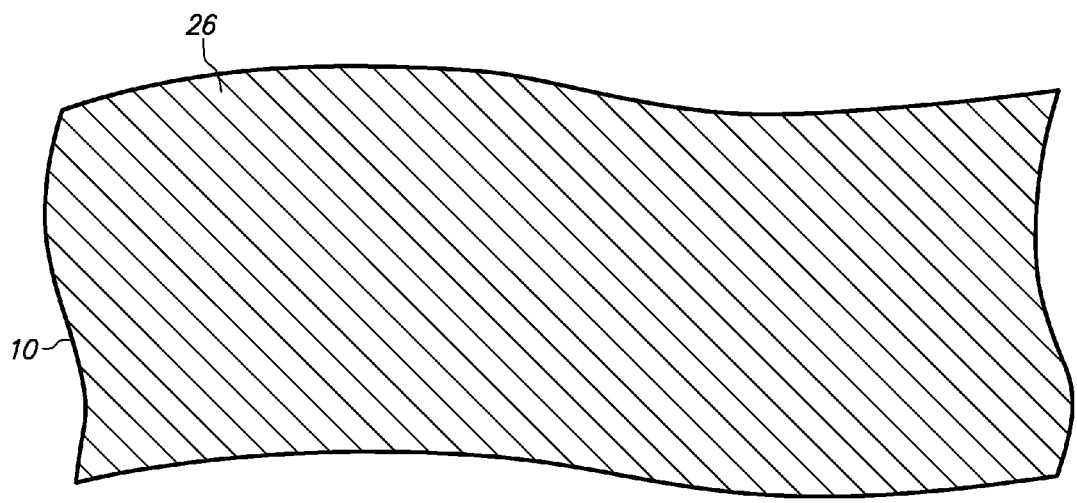

FIGS. 1A-1D are cross-sectional views showing a method of making a thermal post, a signal post and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 330 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch mask 16 and cover mask 18 formed on metal plate 10. Etch mask 16 and cover mask 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A reticle (not shown) is positioned proximate to photoresist layer 16. Thereafter, photoresist layer 16 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12, and photoresist layer 18 remains unpatterned and covers surface 14.

FIG. 1C is a cross-sectional view of recess 20 formed into but not through metal plate 10 by etching metal plate 10 in the pattern defined by etch mask 16. The etching is illustrated as a front-side wet chemical etch. For instance, the structure can be inverted so that etch mask 16 faces downward and cover mask 18 faces upward as a bottom spray nozzle (not shown) that faces etch mask 16 upwardly sprays the wet chemical etch on metal plate 10 and etch mask 16 while a top spray nozzle (not shown) that faces cover mask 18 is deactivated so that gravity assists with removing the etched byproducts. Alternatively, the structure can be dipped in the wet chemical etch since cover mask 18 provides back-side protection. The wet chemical etch is highly selective of copper and etches 300 microns into metal plate 10. As a result, recess 20 extends from surface 12 into but not through metal plate 10, is spaced from surface 14 by 30 microns and has a depth of 300 microns. The wet chemical etch also laterally undercuts metal plate 10 beneath etch mask 16. A suitable wet chemical etch can be provided by a solution containing alkaline ammonia or a dilute mixture of nitric and hydrochloric acid. Likewise, the wet chemical etch can be acidic or alkaline. The optimal etch time for forming recess 20 without excessively exposing metal plate 10 to the wet chemical etch can be established through trial and error.

FIGS. 1D, 1E and 1F are cross-sectional, top and bottom views, respectively, of metal plate 10 after etch mask 16 and cover mask 18 are removed. The photoresist layers are stripped using a solvent, such as a strong alkaline solution containing potassium hydroxide with a pH of 14, that is highly selective of photoresist with respect to copper.

Metal plate 10 as etched includes thermal post 22, signal post 24 and base 26.

Thermal post 22 is a first unetched portion of metal plate 10 defined by etch mask 16. Thermal post 22 is adjacent to and integral with and protrudes above base 26 and is laterally surrounded by recess 20. Thermal post 22 has a height of 300 microns (recess 20 depth), a diameter at its top surface (circular portion of surface 12) of 1000 microns and a diameter at its bottom (circular portion adjacent to base 26) of 1100 microns. Thus, thermal post 22 has a cut-off conical shape (resembling a frustum) with tapered sidewalls in which its diameter decreases as it extends upwardly from base 26 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Signal post 24 is a second unetched portion of metal plate 10 defined by etch mask 16. Signal post 24 is adjacent to and integral with and protrudes above base 26 and is laterally surrounded by recess 20 and laterally spaced from thermal post 22. Signal post 24 has a height of 300 microns (recess 20 depth), a diameter at its top surface (circular portion of surface 12) of 300 microns and a diameter at its bottom (circular portion adjacent to base 26) of 400 microns. Thus, signal post 24 has a cut-off conical shape (resembling a frustum) with tapered sidewalls in which its diameter decreases as it extends upwardly from base 26 to its flat circular top surface. The tapered sidewalls arise from the lateral undercutting by the wet chemical etch beneath etch mask 16. The top surface is concentrically disposed within a periphery of the bottom (shown in phantom in FIG. 1E).

Base 26 is an unetched portion of metal plate 10 that is below posts 22 and 24, extends laterally from posts 22 and 24 in a lateral plane (with lateral directions such as left and right) and has a thickness of 30 microns (330−300).

Thermal post 22, signal post 24 and base 26 can be treated to improve bondability to epoxy and solder. For instance, posts 22 and 24 and base 26 can be chemically oxidized or microetched to provide rougher surfaces.

Thermal post 22, signal post 24 and base 26 are illustrated as a subtractively formed single-piece metal (copper). Thermal post 22, signal post 24 and base 26 can also be a stamped single-piece metal formed by stamping metal plate 10 with a contact piece with a first recess or hole that defines thermal post 22 and a second recess or hole that defines signal post 24. Posts 22 and 24 can also be formed additively by depositing posts 22 and 24 on base 26 using electroplating, chemical vapor deposition (CVD), physical vapor deposition (PVD) and so on, for instance by electroplating a solder thermal post 22 and a solder signal post 24 on a copper base 26, in which case thermal post 22 and base 26 have a metallurgical interface and are adjacent to but not integral with one another and signal post 24 and base 26 have a metallurgical interface and are adjacent to but not integral with one another. Posts 22 and 24 can also be formed semi-additively, for instance by depositing upper portions of posts 22 and 24 on etch-defined lower portions of posts 22 and 24. Posts 22 and 24 and base 26 can also be formed semi-additively by depositing conformal upper portions of posts 22 and 24 and base 26 on etch-defined lower portions of posts 22 and 24 and base 26. Posts 22 and 24 can also be sintered to base 26.

Figure 2A:
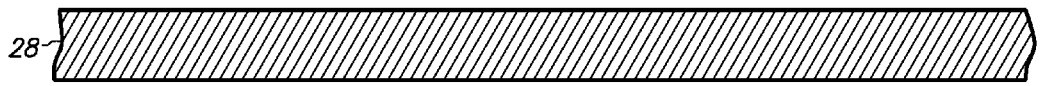
FIGS. 2A and 2B are cross-sectional views showing a method of making an adhesive in accordance with an embodiment of the present invention.
Figure 2B:
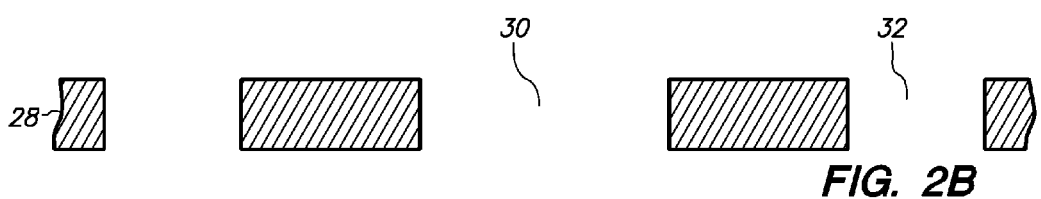
Figure 2C:
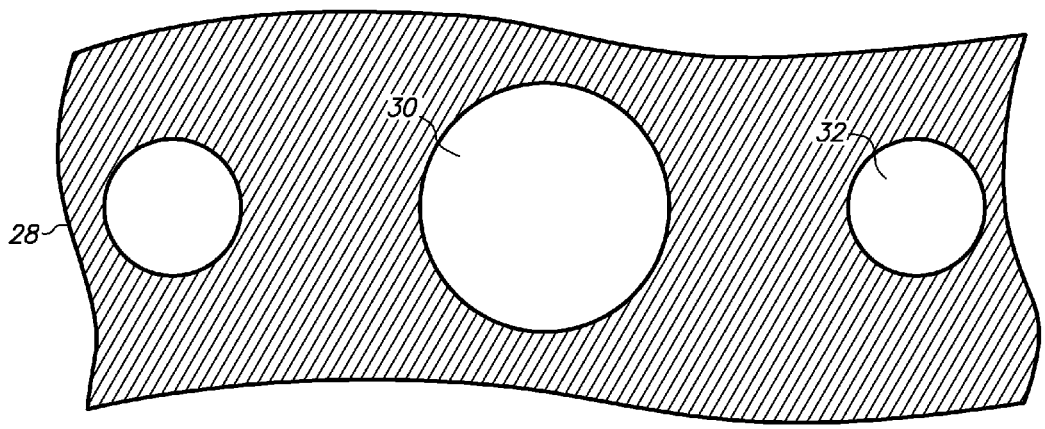
FIGS. 2C and 2D are top and bottom views, respectively, corresponding to FIG. 2B.
Figure 2D:
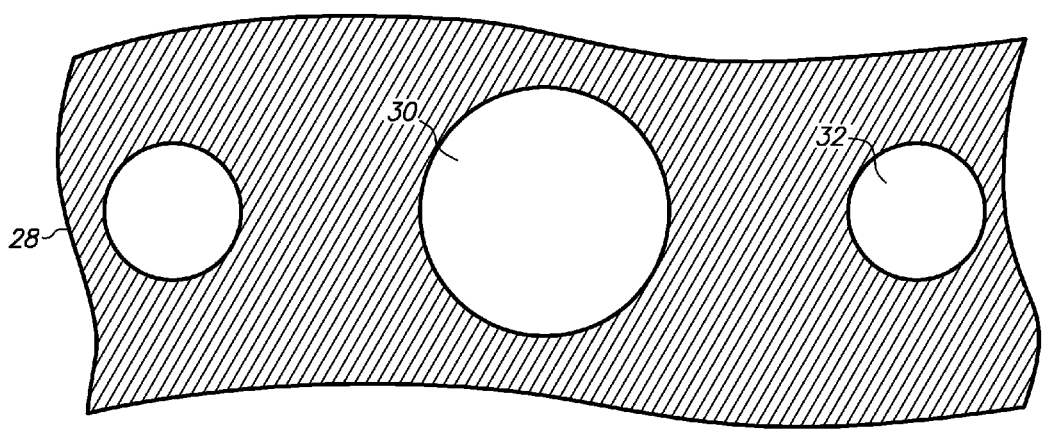

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 28. Adhesive 28 is illustrated as a prepreg with B-stage uncured epoxy provided as a non-solidified unpatterned sheet with a thickness of 180 microns.

Adhesive 28 can be various dielectric films or prepregs formed from numerous organic or inorganic electrical insulators. For instance, adhesive 28 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 28 with openings 30 and 32. Opening 30 is a first window that extends through adhesive 28 and has a diameter of 1150 microns, and opening 32 is a second window that extends through adhesive 28 and has a diameter of 450 microns. Openings 30 and 32 are formed by mechanical drilling through the prepreg and can be formed by other techniques such as punching and stamping.

Figure 3A:
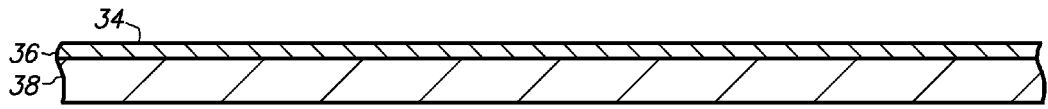
FIGS. 3A and 3B are cross-sectional views showing a method of making a substrate in accordance with an embodiment of the present invention.
Figure 3B:
Figure 3C:
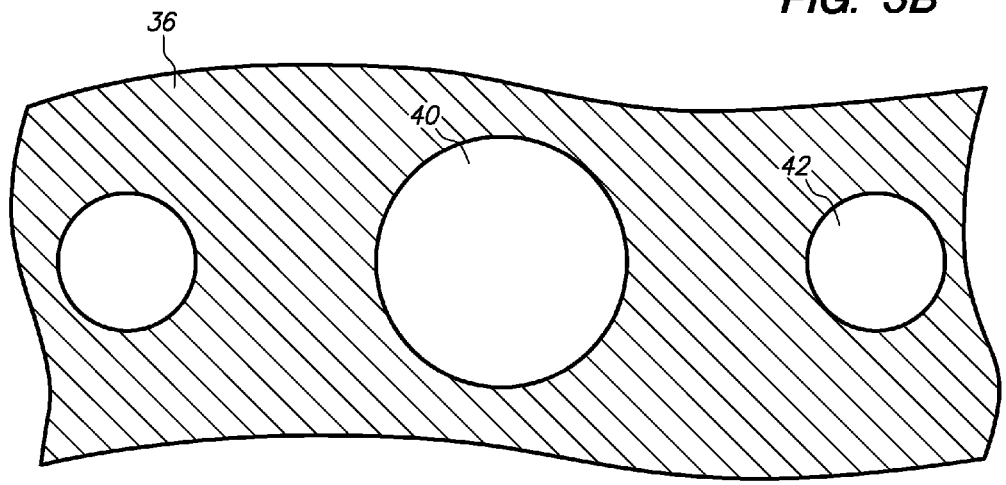
FIGS. 3C and 3D are top and bottom views, respectively, corresponding to FIG. 3B.
Figure 3D:
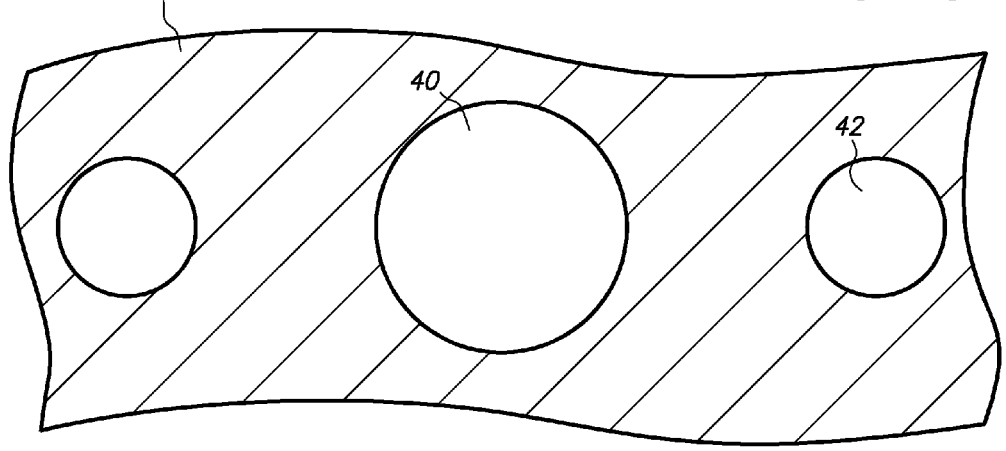

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 34 that includes conductive layer 36 and dielectric layer 38. Conductive layer 36 is an electrical conductor that contacts and extends above dielectric layer 38, and dielectric layer 38 is an electrical insulator. For instance, conductive layer 36 is an unpatterned copper sheet with a thickness of 30 microns, and dielectric layer 38 is epoxy with a thickness of 150 microns.

FIGS. 3B, 3C and 3D are cross-sectional, top and bottom views, respectively, of substrate 34 with apertures 40 and 42. Aperture 40 is a first window that extends through substrate 34 and has a diameter of 1150 microns, and aperture 42 is a second window that extends through substrate 34 and has a diameter of 450 microns. Apertures 40 and 42 are formed by mechanical drilling through conductive layer 36 and dielectric layer 38 and can be formed with other techniques such as punching and stamping. Preferably, opening 30 and aperture 40 have the same diameter and are formed in the same manner with the same drill bit at the same drilling station, and opening 32 and aperture 42 have the same diameter and are formed in the same manner with the same drill bit at the same drilling station.

Substrate 34 is illustrated as a laminated structure. Substrate 34 can be other electrical interconnects such as a ceramic board or a printed circuit board. Likewise, substrate 34 can include additional layers of embedded circuitry.

Figure 4A:
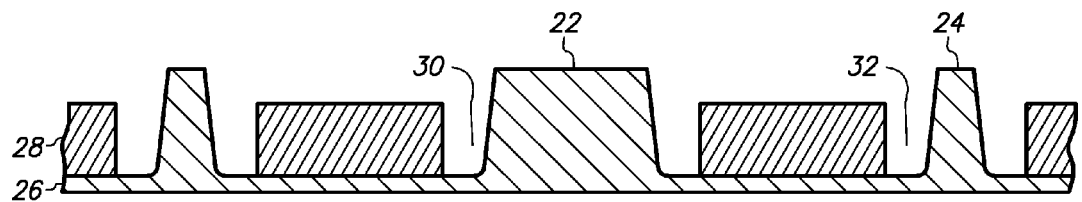
FIGS. 4A-4L are cross-sectional views showing a method of making a thermal board with a substrate on an adhesive in accordance with an embodiment of the present invention.
Figure 4B:
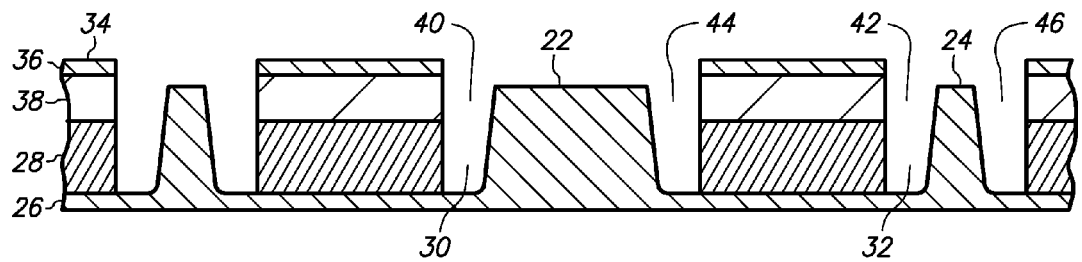
Figure 4C:
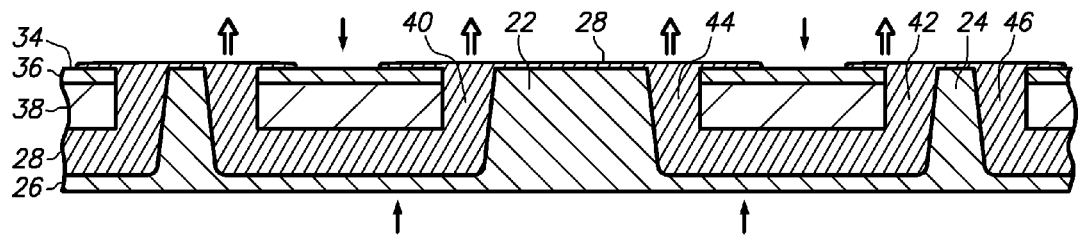
Figure 4D:
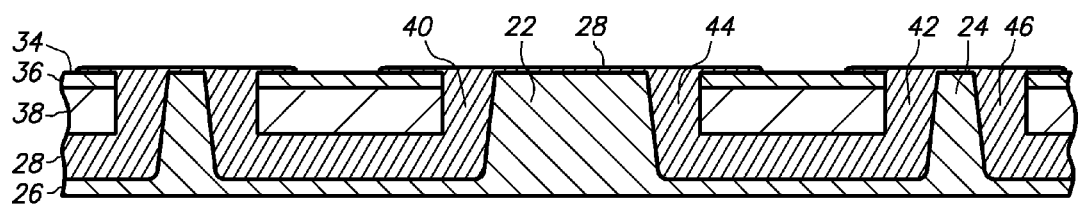
Figure 4E:
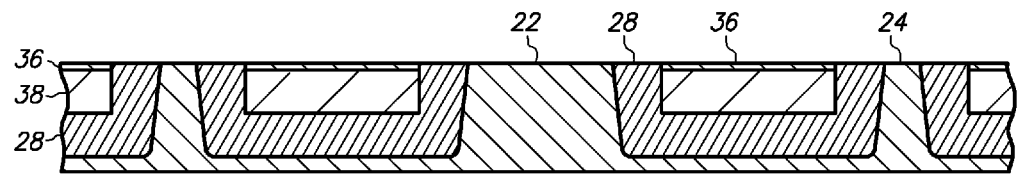
Figure 4F:
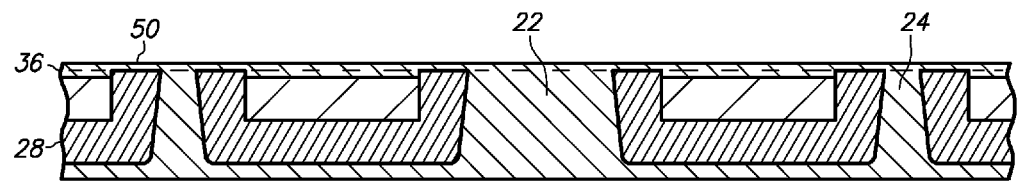
Figure 4G:
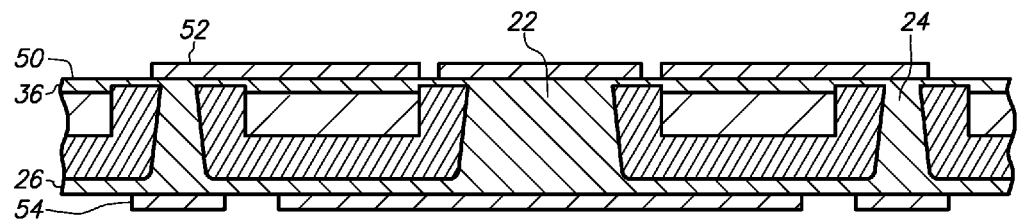
Figure 4H:
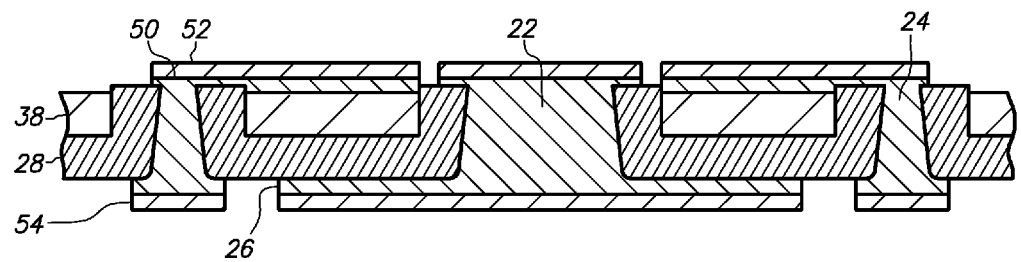
Figure 4I:
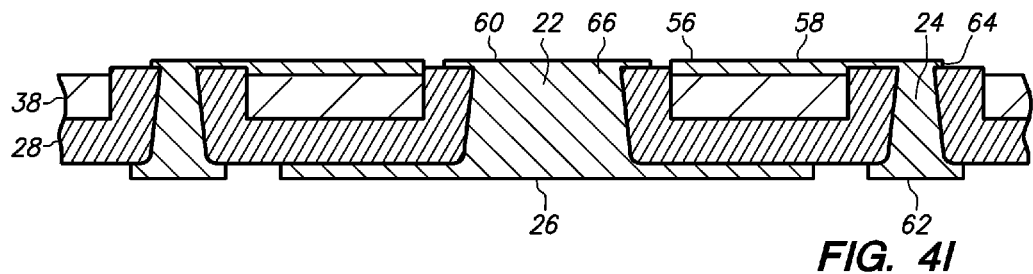
Figure 4J:
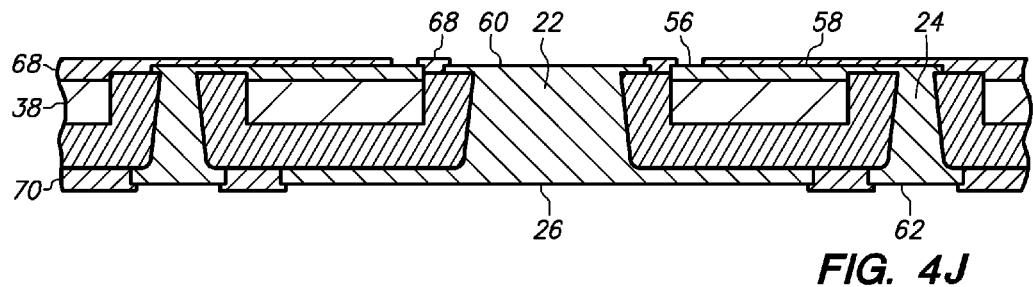
Figure 4K:
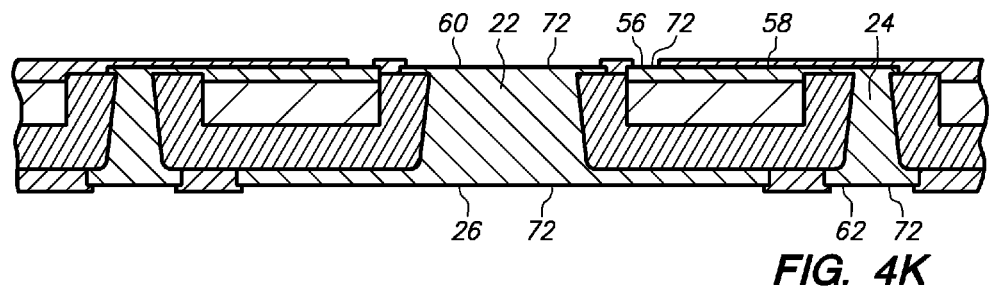
Figure 4L:
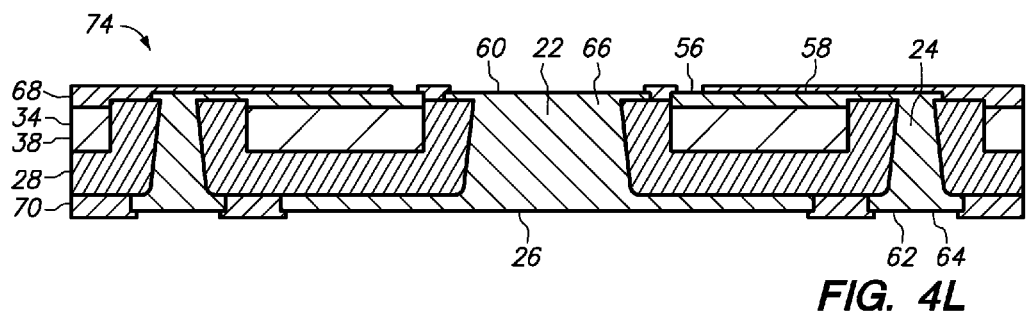
Figure 4M:
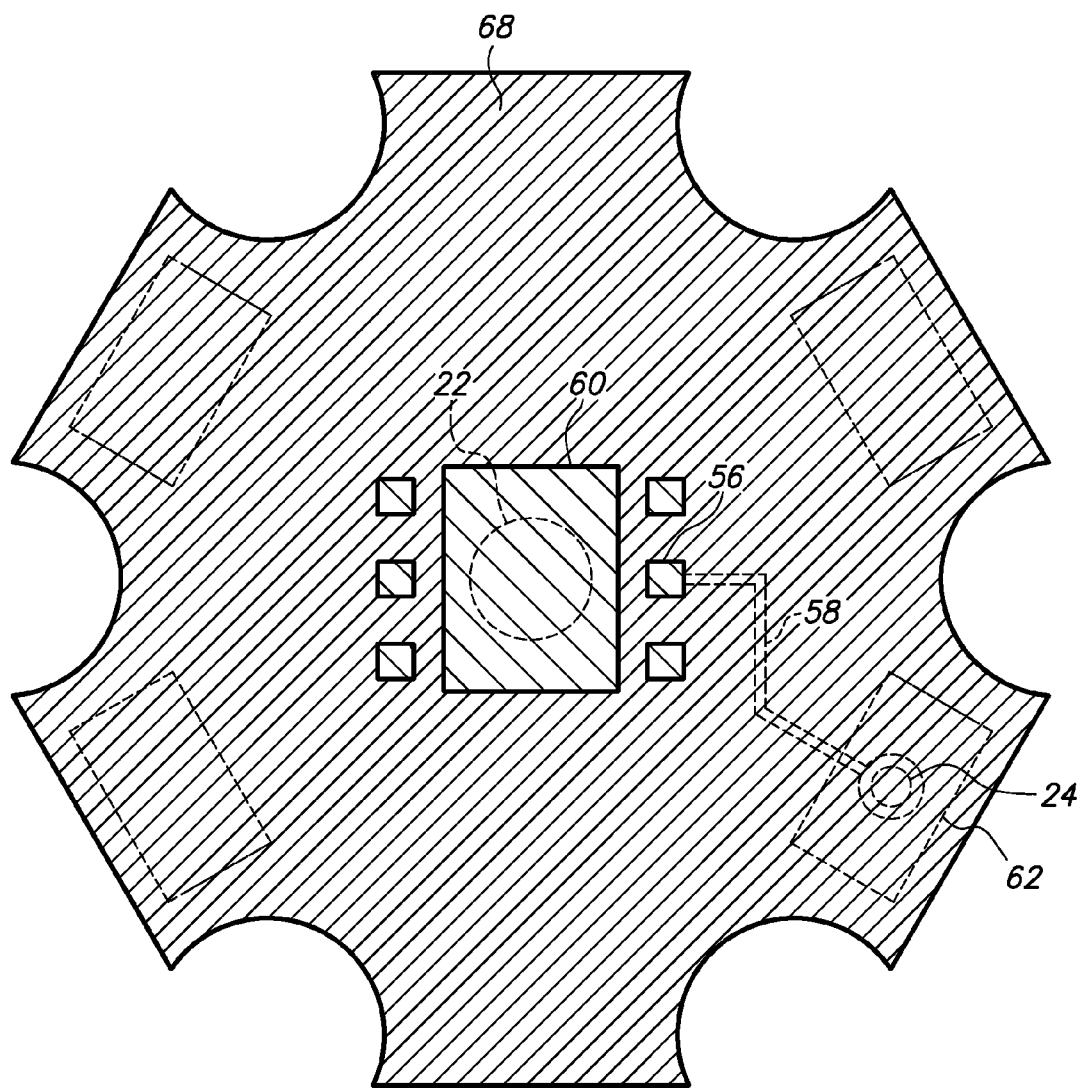
FIGS. 4M and 4N are top and bottom views, respectively, corresponding to FIG. 4L.
Figure 4N:
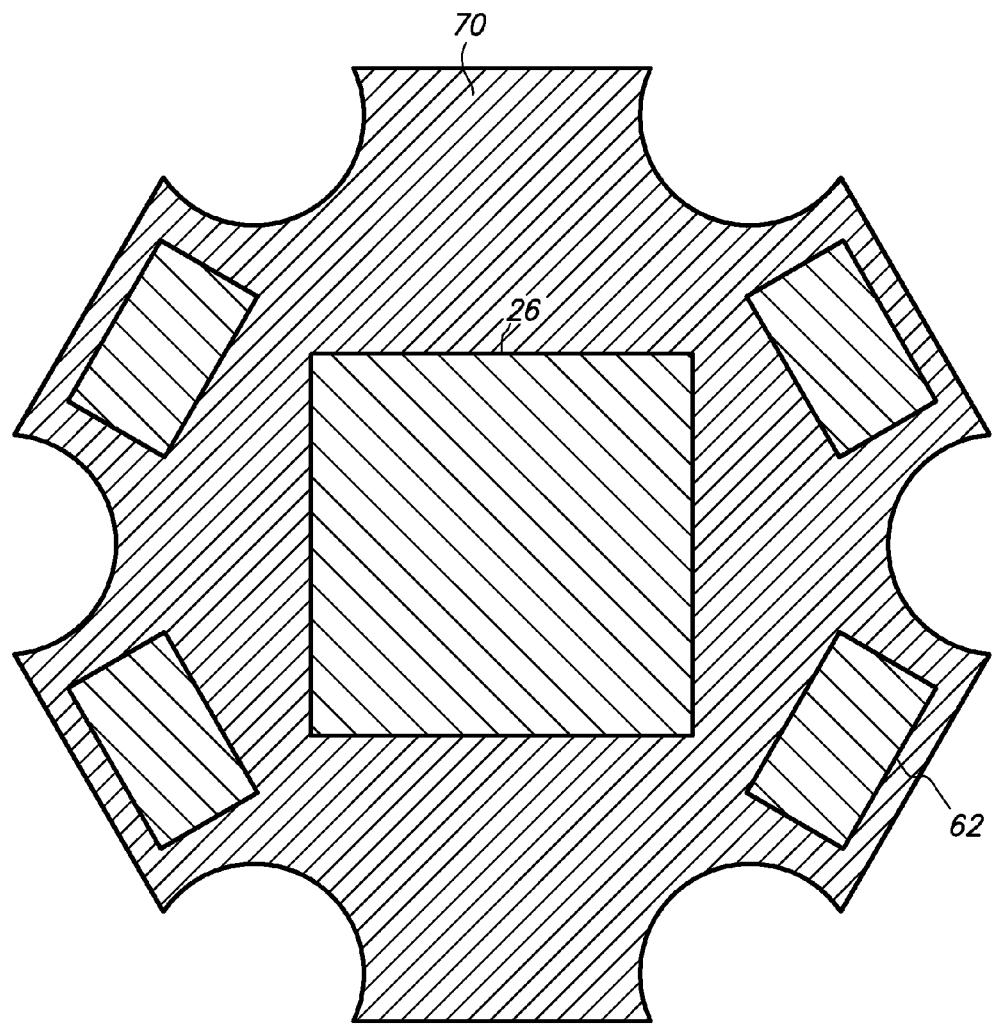

FIGS. 4A-4L are cross-sectional views showing a method of making a thermal board that includes thermal post 22, signal post 24, base 26, adhesive 28 and substrate 34 in accordance with an embodiment of the present invention, and FIGS. 4M and 4N are top and bottom views, respectively, corresponding to FIG. 4L.

FIG. 4A is a cross-sectional view of the structure with adhesive 28 mounted on base 26. Adhesive 28 is mounted by lowering it onto base 26 as thermal post 22 is inserted into and through and upwards in opening 30 and signal post 24 is inserted into and through and upwards in opening 32. Adhesive 28 eventually contacts and rests on base 26. Preferably, thermal post 22 is inserted into and extends through opening 30 without contacting adhesive 28 and is aligned with and centrally located within opening 30, and signal post 24 is inserted into and extends through opening 32 without contacting adhesive 28 and is aligned with and centrally located within opening 32.

FIG. 4B is a cross-sectional view of the structure with substrate 34 mounted on adhesive 28. Substrate 34 is mounted by lowering it onto adhesive 28 as thermal post 22 is inserted into and upwards in aperture 40 and signal post 24 is inserted into and upwards in aperture 42. Substrate 34 eventually contacts and rests on adhesive 28.

Thermal post 22 is inserted into but not through aperture 40 without contacting substrate 34 and is aligned with and centrally located within aperture 40. As a result, gap 44 is located in aperture 40 between thermal post 22 and substrate 34. Gap 44 laterally surrounds thermal post 22 and is laterally surrounded by substrate 34. In addition, opening 30 and aperture 40 are precisely aligned with one another and have the same diameter.

Signal post 24 is inserted into but not through aperture 42 without contacting substrate 34 and is aligned with and centrally located within aperture 42. As a result, gap 46 is located in aperture 42 between signal post 24 and substrate 34. Gap 46 laterally surrounds signal post 24 and is laterally surrounded by substrate 34. In addition, opening 32 and aperture 42 are precisely aligned with one another and have the same diameter.

At this stage, substrate 34 is mounted on and contacts and extends above adhesive 28. Thermal post 22 extends through opening 30 into aperture 40 to dielectric layer 38, is 60 microns below the top surface of conductive layer 36 and is exposed through aperture 40 in the upward direction. Signal post 24 extends through opening 32 into aperture 42 to dielectric layer 38, is 60 microns below the top surface of conductive layer 36 and is exposed through aperture 42 in the upward direction. Adhesive 28 contacts and is sandwiched between base 26 and substrate 34, contacts dielectric layer 38 but is spaced from conductive layer 36 and remains a non-solidified prepreg with B-stage uncured epoxy, and gaps 44 and 46 are filled with air.

FIG. 4C is a cross-sectional view of the structure with adhesive 28 in gaps 44 and 46. Adhesive 28 is flowed into gaps 44 and 46 by applying heat and pressure. In this illustration, adhesive 28 is forced into gaps 44 and 46 by applying downward pressure to conductive layer 36 and/or upward pressure to base 26, thereby moving base 26 and substrate 34 towards one another and applying pressure to adhesive 28 while simultaneously applying heat to adhesive 28. Adhesive 28 becomes compliant enough under the heat and pressure to conform to virtually any shape. As a result, adhesive 28 sandwiched between base 26 and substrate 34 is compressed, forced out of its original shape and flows into and upward in gaps 44 and 46. Base 26 and substrate 34 continue to move towards one another and adhesive 28 eventually fills gaps 44 and 46. Moreover, adhesive 28 remains sandwiched between and continues to fill the reduced space between base 26 and substrate 34.

For instance, base 26 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between base 26 and the bottom platen. The stack includes the top platen, top cull plate, top buffer paper, substrate 34, adhesive 28, base 26, bottom buffer paper, bottom cull plate and bottom platen in descending order. Furthermore, the stack may be positioned on the bottom platen by tooling pins (not shown) that extend upward from the bottom platen through registration holes (not shown) in base 26.

The platens are heated and move towards one another, thereby applying heat and pressure to adhesive 28. The cull plates disperse the heat from the platens so that it is more uniformly applied to base 26 and substrate 34 and thus adhesive 28, and the buffer papers disperse the pressure from the platens so that it is more uniformly applied to base 26 and substrate 34 and thus adhesive 28. Initially, dielectric layer 38 contacts and presses down on adhesive 28. As the platen motion and heat continue, adhesive 28 between base 26 and substrate 34 is compressed, melted and flows into and upward in gaps 44 and 46 and across dielectric layer 38 to conductive layer 36. For instance, the uncured epoxy is melted by the heat and the molten uncured epoxy is squeezed by the pressure into gaps 44 and 46, however the reinforcement and the filler remain between base 26 and substrate 34. Adhesive 28 elevates more rapidly than thermal post 22 in aperture 40 and fills gap 44, and elevates more rapidly than signal post 24 in aperture 42 and fills gap 46. Adhesive 28 also rises slightly above gaps 44 and 46, overflows onto the top surfaces of thermal post 22 and conductive layer 36 adjacent to gap 44 and overflows onto the top surfaces of signal post 24 and conductive layer 36 adjacent to gap 46 before the platen motion stops. This may occur due to the prepreg being slightly thicker than necessary. As a result, adhesive 28 creates a thin coating on the top surfaces of thermal post 22 and signal post 24. The platen motion is eventually blocked by posts 22 and 24 and the platens become stationary but continue to apply heat to adhesive 28.

The upward flow of adhesive 28 in gaps 44 and 46 is shown by the thick upward arrows, the upward motion of posts 22 and 24 and base 26 relative to substrate 34 is shown by the thin upward arrows, and the downward motion of substrate 34 relative to posts 22 and 24 and base 26 is shown by the thin downward arrows.

FIG. 4D is a cross-sectional view of the structure with adhesive 28 solidified.

For instance, the platens continue to clamp thermal post 22, signal post 24 and base 26 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 28 as solidified provides a secure robust mechanical bond between thermal post 22 and substrate 34, between signal post 24 and substrate 34 and between base 26 and substrate 34. Adhesive 28 can withstand normal operating pressure without distortion or damage and is only temporarily distorted under unusually high pressure. Furthermore, adhesive 28 can absorb thermal expansion mismatch between thermal post 22 and substrate 34, between signal post 24 and substrate 34 and between base 26 and substrate 34.

At this stage, thermal post 22, signal post 24 and conductive layer 36 are essentially coplanar with one another and adhesive 28 and conductive layer 36 extend to a top surface that faces in the upward direction. For instance, adhesive 28 between base 26 and dielectric layer 38 has a thickness of 120 microns which is 60 microns less than its initial thickness of 180 microns, thermal post 22 ascends 60 microns in aperture 40, signal post 24 ascends 60 microns in aperture 42 and substrate 34 descends 60 microns relative to posts 22 and 24. The 300 micron height of thermal post 22 and of signal post 24 is essentially the same as the combined height of conductive layer 36 (30 microns), dielectric layer 38 (150 microns) and the underlying adhesive 28 (120 microns). Furthermore, thermal post 22 continues to be centrally located in opening 30 and aperture 40 and spaced from substrate 34, signal post 24 continues to be centrally located in opening 32 and aperture 42 and spaced from substrate 34 and adhesive 28 fills the space between base 26 and substrate 34 and fills gaps 44 and 46. For instance, gap 44 (as well as adhesive 28 between thermal post 22 and substrate 34) has a width of 75 microns ((1150−1000)/2) at the top surface of thermal post 22, and gap 46 (as well as adhesive 28 between signal post 24 and substrate 34) has a width of 75 microns ((450−300)/2) at the top surface of signal post 24. Adhesive 28 extends across dielectric layer 38 in gaps 44 and 46. That is, adhesive 28 in gap 44 extends in the upward and downward directions across the thickness of dielectric layer 38 at the outer sidewall of gap 44, and adhesive 28 in gap 46 extends in the upward and downward directions across the thickness of dielectric layer 38 at the outer sidewall of gap 46. Adhesive 28 also includes thin top portions above gaps 44 and 46 that contact the top surfaces of posts 22 and 24 and conductive layer 36 and extends above posts 22 and 24 by 10 microns.

FIG. 4E is a cross-sectional view of the structure after upper portions of thermal post 22, signal post 24, adhesive 28 and conductive layer 36 are removed.

Thermal post 22, signal post 24, adhesive 28 and conductive layer 36 have their upper portions removed by grinding. For instance, a rotating diamond sand wheel and distilled water are applied to the top of the structure. Initially, the diamond sand wheel grinds only adhesive 28. As the grinding continues, adhesive 28 becomes thinner as its grinded surface migrates downwardly. Eventually the diamond sand wheel contacts posts 22 and 24 and conductive layer 36 (not necessarily at the same time), and as a result, begins to grind posts 22 and 24 and conductive layer 36 as well. As the grinding continues, posts 22 and 24, adhesive 28 and conductive layer 36 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 28, a 15 micron thick upper portion of thermal post 22, a 15 micron thick upper portion of signal post 24 and a 15 micron thick upper portion of conductive layer 36. The decreased thickness does not appreciably affect thermal post 22, signal post 24 or adhesive 28. However, it substantially reduces the thickness of conductive layer 36 from 30 microns to 15 microns.

At this stage, thermal post 22, signal post 24, adhesive 28 and conductive layer 36 are coplanar with one another at a smoothed lapped lateral top surface that is above dielectric layer 38 and faces in the upward direction. Likewise, thermal post 22, signal post 24 and adhesive 28 are coplanar with one another at base 26.

FIG. 4F is a cross-sectional view of the structure with conductive layer 50 deposited on thermal post 22, signal post 24, adhesive 28 and conductive layer 36.

Conductive layer 50 contacts thermal post 22, signal post 24, adhesive 28 and conductive layer 36 and covers them in the upward direction. For instance, the structure is dipped in an activator solution to render adhesive 28 catalytic to electroless copper, then a first copper layer is electrolessly plated on thermal post 22, signal post 24, adhesive 28 and conductive layer 36, and then a second copper layer is electroplated on the first copper layer. The first copper layer has a thickness of 2 microns, the second copper layer has a thickness of 13 microns, and conductive layer 50 has a thickness of 15 microns. As a result, conductive layer 36 essentially grows and has a thickness of 30 microns (15+15). Thus, conductive layer 50 serves as a cover layer for thermal post 22 and signal post 24 and a build-up layer for conductive layer 36. Thermal post 22, signal post 24 and conductive layer 50, and conductive layers 36 and 50 are shown as a single layer for convenience of illustration. The boundary (shown in phantom) between thermal post 22 and conductive layer 50, between signal post 24 and conductive layer 50 and between conductive layers 36 and 50 may be difficult or impossible to detect since copper is plated on copper. However, the boundary between adhesive 28 and conductive layer 50 is clear.

FIG. 4G is a cross-sectional view of the structure with etch mask 52 and etch mask 54 formed on the top and bottom surfaces, respectively, of the structure. Etch masks 52 and 54 are illustrated as photoresist layers similar to photoresist layer 16. Photoresist layer 52 has a pattern that selectively exposes conductive layer 50, and photoresist layer 54 has a pattern that selectively exposes base 26.

FIG. 4H is a cross-sectional view of the structure with selected portions of conductive layers 36 and 50 removed by etching conductive layers 36 and 50 in the pattern defined by etch mask 52, and selected portions of base 26 removed by etching base 26 in the pattern defined by etch mask 54. The etching is a front-side and back-side wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layers 36 and 50 to expose adhesive 28 and dielectric layer 38 and converts conductive layers 36 and 50 from unpatterned into patterned layers. The wet chemical etch also etches through base 26 to expose adhesive 28.

FIG. 4I is a cross-sectional view of the structure after etch masks 52 and 54 are removed. Photoresist layers 52 and 54 can be stripped in the same manner as photoresist layers 16 and 18.

Conductive layers 36 and 50 as etched include pad 56 and routing line 58, and conductive layer 50 as etched includes cap 60. Pad 56 and routing line 58 are unetched portions of conductive layers 36 and 50 defined by etch mask 52, and cap 60 is an unetched portion of conductive layer 50 defined by etch mask 52. Thus, conductive layers 36 and 50 are a patterned layer that includes pad 56 and routing line 58 and excludes cap 60. Furthermore, routing line 58 is a copper trace that contacts and extends above dielectric layer 38 and is adjacent to and electrically connects signal post 24 and pad 56.

Base 26 as etched includes base 26, reduced to its central portion, and terminal 62. Base 26 is an unetched portion of base 26 defined by etch mask 54 and extends laterally beyond thermal post 22 by 1000 microns in the lateral directions, and terminal 62 is an unetched portion of base 26 defined by etch mask 54 that is adjacent to and extends below and laterally from signal post 24 and contacts and extends below adhesive 28. Base 26 remains an unpatterned layer, and a patterned layer that is laterally spaced from and outside the periphery of base 26 includes terminal 62. Thus, terminal 62 is spaced and separated from and no longer a part of base 26. Furthermore, signal post 24 is adjacent to and electrically connects routing line 58 and terminal 62.

Conductive trace 64 is provided by signal post 24, pad 56, routing line 58 and terminal 62. Similarly, an electrically conductive path between pad 56 and terminal 62 is signal post 24 and routing line 58. Conductive trace 64 provides vertical (top to bottom) routing from pad 56 to terminal 62. Conductive trace 64 is not be limited to this configuration. For instance, the electrically conductive path can include vias that extend through dielectric layer 38 and additional routing lines (above and/or below dielectric layer 38) as well as passive components such as resistors and capacitors mounted on additional pads.

Heat spreader 66 includes thermal post 22, base 26 and cap 60. Thermal post 22 and base 26 are integral with one another. Cap 60 is above and adjacent to and covers in the upward direction and extends laterally in the lateral directions from the top of thermal post 22. Cap 60 is positioned so that thermal post 22 is centrally located within its periphery. Cap 60 also contacts the underlying portion of adhesive 28 that is coplanar with and adjacent to and laterally surrounds thermal post 22 and covers this portion in the upward direction.

Heat spreader 66 is essentially a heat slug with an inverted T-like shape that includes a pedestal (thermal post 22), wings (base 26 portions that extend laterally from the pedestal) and a thermal pad (cap 60).

FIG. 4J is a cross-sectional view of the structure with solder mask 68 formed on adhesive 28, dielectric layer 38, conductive layer 50 and cap 60 and solder mask 70 formed on base 26, adhesive 28 and terminal 62.

Solder mask 68 is an electrically insulative layer that is selectively patterned to expose pad 56 and cap 60 and cover routing line 58 and the exposed portions of adhesive 28 and dielectric layer 38 in the upward direction. Solder mask 68 has a thickness of 25 microns above pad 56 and cap 60 and extends 55 microns (30+25) above dielectric layer 38.

Solder mask 70 is an electrically insulative layer that is selectively patterned to expose base 26 and terminal 62 and cover the exposed portions of adhesive 28 in the downward direction. Solder mask 70 has a thickness of 25 microns below base 26 and terminal 62 and extends 55 microns (30+25) below adhesive 28.

Solder masks 68 and 70 can initially be a photoimageable liquid resin that is dispensed on the structure. Thereafter, solder masks 68 and 70 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

FIG. 4K is a cross-sectional view of the structure with plated contacts 72 formed on base 26, pad 56, cap 60 and terminal 62.

Plated contacts 72 are thin spot plated metal coatings that contact base 26 and terminal 62 and cover their exposed portions in the downward direction and contact pad 56 and cap 60 and cover their exposed portions in the upward direction. For instance, a nickel layer is electrolessly plated on base 26, pad 56, cap 60 and terminal 62, and then a gold layer is electrolessly plated on the nickel layer. The buried nickel layer has a thickness of 3 microns, the gold surface layer has a thickness of 0.5 microns, and plated contacts 72 have a thickness of 3.5 microns.

Base 26, pad 56, cap 60 and terminal 62 treated with plated contacts 72 as a surface finish have several advantages. The buried nickel layer provides the primary mechanical and electrical and/or thermal connection, and the gold surface layer provides a wettable surface to facilitate solder reflow. Plated contacts 72 also protect base 26, pad 56, cap 60 and terminal 62 from corrosion. Plated contacts 72 can include a wide variety of metals to accommodate the external connection media. For instance, a silver surface layer plated on a buried nickel layer can accommodate a solder joint or a wire bond.

Base 26, pad 56, cap 60 and terminal 62 treated with plated contacts 72 are shown as single layers for convenience of illustration. The boundary (not shown) with plated contacts 72 in base 26, pad 56, cap 60 and terminal 62 occurs at the copper/nickel interface.

At this stage, the manufacture of thermal board 74 can be considered complete.

FIGS. 4L, 4M and 4N are cross-sectional, top and bottom views, respectively, of thermal board 74 after it is detached at peripheral edges along cut lines from a support frame and/or adjacent thermal boards in a batch.

Thermal board 74 includes adhesive 28, substrate 34, conductive trace 64, heat spreader 66 and solder masks 68 and 70. Substrate 34 includes dielectric layer 38. Conductive trace 64 includes signal post 24, pad 56, routing line 58 and terminal 62. Heat spreader 66 includes thermal post 22, base 26 and cap 60.

Thermal post 22 extends through opening 30 and into aperture 40, remains centrally located within opening 30 and aperture 40 and is coplanar at its top with an adjacent portion of adhesive 28 above dielectric layer 38 and at its bottom with an adjacent portion of adhesive 28 that contacts base 26. Thermal post 22 retains its cut-off conical shape with tapered sidewalls in which its diameter decreases as it extends upwardly from base 26 to its flat circular top adjacent to cap 60.

Signal post 24 extends through opening 32 and into aperture 42, remains centrally located within opening 32 and aperture 42 and is coplanar at its top with an adjacent portion of adhesive 28 above dielectric layer 38 and at its bottom with an adjacent portion of adhesive 28 that contacts terminal 62. Signal post 24 retains its cut-off conical shape with tapered sidewalls in which its diameter decreases as it extends upwardly from terminal 62 to its flat circular top adjacent to routing line 58.

Base 26 covers thermal post 22 and cap 60 in the downward direction and is spaced from the peripheral edges of thermal board 74.

Cap 60 is above and adjacent to and thermally connected to thermal post 22, covers the top of thermal post 22 in the upward direction and laterally extends from the top of thermal post 22 in the lateral directions. Cap 60 also contacts and covers in the upward direction a portion of adhesive 28 that is coplanar with and adjacent to and laterally surrounds thermal post 22. Cap 60 is also coplanar with pad 56.

Adhesive 28 is mounted on and extends above base 26, contacts and is sandwiched between and fills the space between thermal post 22 and dielectric layer 38 in gap 44, contacts and is sandwiched between and fills the space between signal post 24 and dielectric layer 38 in gap 46, contacts and is sandwiched between and fills the space between base 26 and dielectric layer 38 outside gaps 44 and 46, extends laterally from thermal post 22 beyond and overlaps terminal 62, covers base 26 outside the periphery of thermal post 22 in the upward direction, covers and surrounds thermal post 22 and signal post 24 in the lateral directions, fills most of the space between substrate 34 and heat spreader 66 and is solidified.

Substrate 34 is mounted on and contacts adhesive 28, extends above the underlying adhesive 28 and extends above base 26, conductive layer 36 (as well as pad 56 and routing line 58) contacts and extends above dielectric layer 38, and dielectric layer 38 contacts and is sandwiched between adhesive 28 and conductive layer 36.

Thermal post 22 and signal post 24 have the same thickness and are coplanar with one another, and base 26 and terminal 62 have the same thickness and are coplanar with one another. Furthermore, posts 22 and 24 are coplanar with adhesive 28 at both their tops and bottoms.

Thermal post 22, signal post 24, base 26, cap 60 and terminal 62 remain spaced from substrate 34. As a result, substrate 34 and heat spreader 66 are mechanically attached and electrically isolated from one another.

Adhesive 28, dielectric layer 38 and solder masks 68 and 70 extend to straight vertical peripheral edges of thermal board 74 after it is detached or singulated from a batch of identical simultaneously manufactured thermal boards.

Pad 56 is customized as an electrical interface for a semiconductor device such as an LED package or a semiconductor chip that is subsequently mounted on cap 60, terminal 62 is customized as an electrical interface for the next level assembly such as a solderable wire from a printed circuit board, cap 60 is customized as a thermal interface for the semiconductor device, and base 26 is customized as a thermal interface for the next level assembly such as the printed circuit board or a heat sink for an electronic device. Furthermore, cap 60 is thermally connected to base 26 by thermal post 22.

Pad 56 and terminal 62 are vertically offset from one another and exposed at the top and bottom surfaces, respectively, of thermal board 74, thereby providing vertical routing between the semiconductor device and the next level assembly.

Pad 56 and cap 60 are coplanar with one another at their top surfaces above dielectric layer 38, and base 26 and terminal 62 are coplanar with one another at their bottom surfaces below adhesive 28.

Conductive trace 64 is shown in cross-section as a continuous circuit trace for convenience of illustration. However, conductive trace 64 typically provides horizontal signal routing in both the X and Y directions. That is, pad 56 and terminal 62 are laterally offset from one another in the X and Y directions, and routing line 58 routes in the X and Y directions.

Heat spreader 66 provides heat spreading and heat dissipation from a semiconductor device that is subsequently mounted on cap 60 to the next level assembly that thermal board 74 is subsequently mounted on. The semiconductor device generates heat that flows into cap 60, from cap 60 into thermal post 22 and through thermal post 22 into base 26 where it is spread out and dissipated in the downward direction, for instance to an underlying heat sink.

Thermal board 74 does not expose thermal post 22, signal post 24 or routing line 58. Thermal post 22 is covered by cap 60, signal post 24 and routing line 58 are covered by solder mask 68, and adhesive 28 is covered by solder masks 68 and 70. Thermal post 22, signal post 24, adhesive 28 and routing line 58 are shown in phantom in FIG. 4M for convenience of illustration.

Thermal board 74 includes other conductive traces 64 that typically include signal post 24, pad 56, routing line 58 and terminal 62. A single conductive trace 64 is described and labeled for convenience of illustration. In conductive traces 64, signal posts 24, pads 56 and terminals 62 generally have identical shapes and sizes whereas routing lines 58 generally have different routing configurations. For instance, some conductive traces 64 may be spaced and separated and electrically isolated from one another whereas other conductive traces 64 can intersect or route to the same pad 56, routing line 58 or terminal 62 and be electrically connected to one another. Likewise, some pads 56 may receive independent signals whereas other pads 56 share a common signal, power or ground.

Thermal board 74 can be adapted for an LED package with blue, green and red LED chips, with each LED chip including an anode and a cathode and each LED package including a corresponding anode terminal and cathode terminal. In this instance, thermal board 74 can include six pads 56 and four terminals 62 so that each anode is routed from a separate pad 56 to a separate terminal 62 whereas each cathode is routed from a separate pad 56 to a common ground terminal 62.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 64 after they are formed. A plating bus can be disconnected during the wet chemical etch that forms pad 56, routing line 58, cap 60 and terminal 62.

Thermal board 74 can include registration holes (not shown) that are drilled or sliced through adhesive 28, substrate 34 and solder masks 68 and 70 so that thermal board 74 can be positioned by inserting tooling pins through the registration holes when it is subsequently mounted on an underlying carrier.

Thermal board 74 can omit cap 60. This can be accomplished by adjusting etch mask 52 to expose conductive layer 50 above all of aperture 40 to the wet chemical etch that forms pad 56 and routing line 58. This can also be accomplished by omitting conductive layer 50.

Thermal board 74 can accommodate multiple semiconductor devices rather than one. This can be accomplished by adjusting etch mask 16 to define additional thermal posts 22 and signal posts 24, adjusting adhesive 28 to include additional openings 30 and 32, adjusting substrate 34 to include additional apertures 40 and 42, adjusting etch mask 52 to define additional pads 56, routing lines 58 and caps 60 and adjusting solder mask 68 to contain additional openings. The elements except for terminals 62 can be laterally repositioned to provide a 2×2 array for four semiconductor devices. In addition, the topography (lateral shape) can be adjusted for some but not all of the elements. For instance, pads 56, caps 60 and terminals 62 can retain the same topography whereas routing lines 58 have different routing configurations.

Figure 5A:
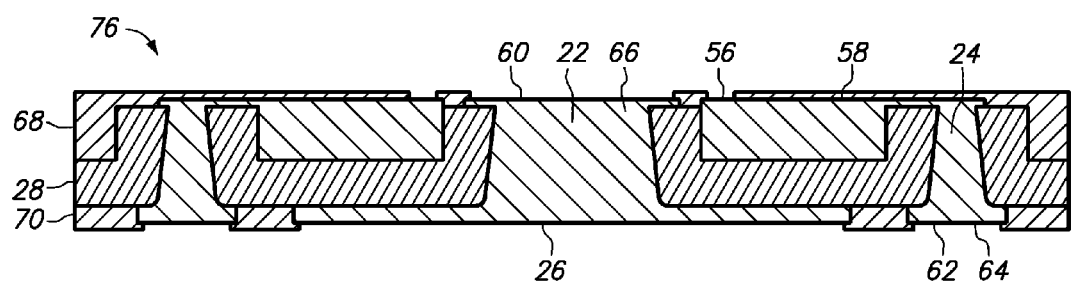
FIGS. 5A, 5B and 5C are cross-sectional, top and bottom views, respectively, of a thermal board with a conductive trace on an adhesive in accordance with an embodiment of the present invention.
Figure 5B:
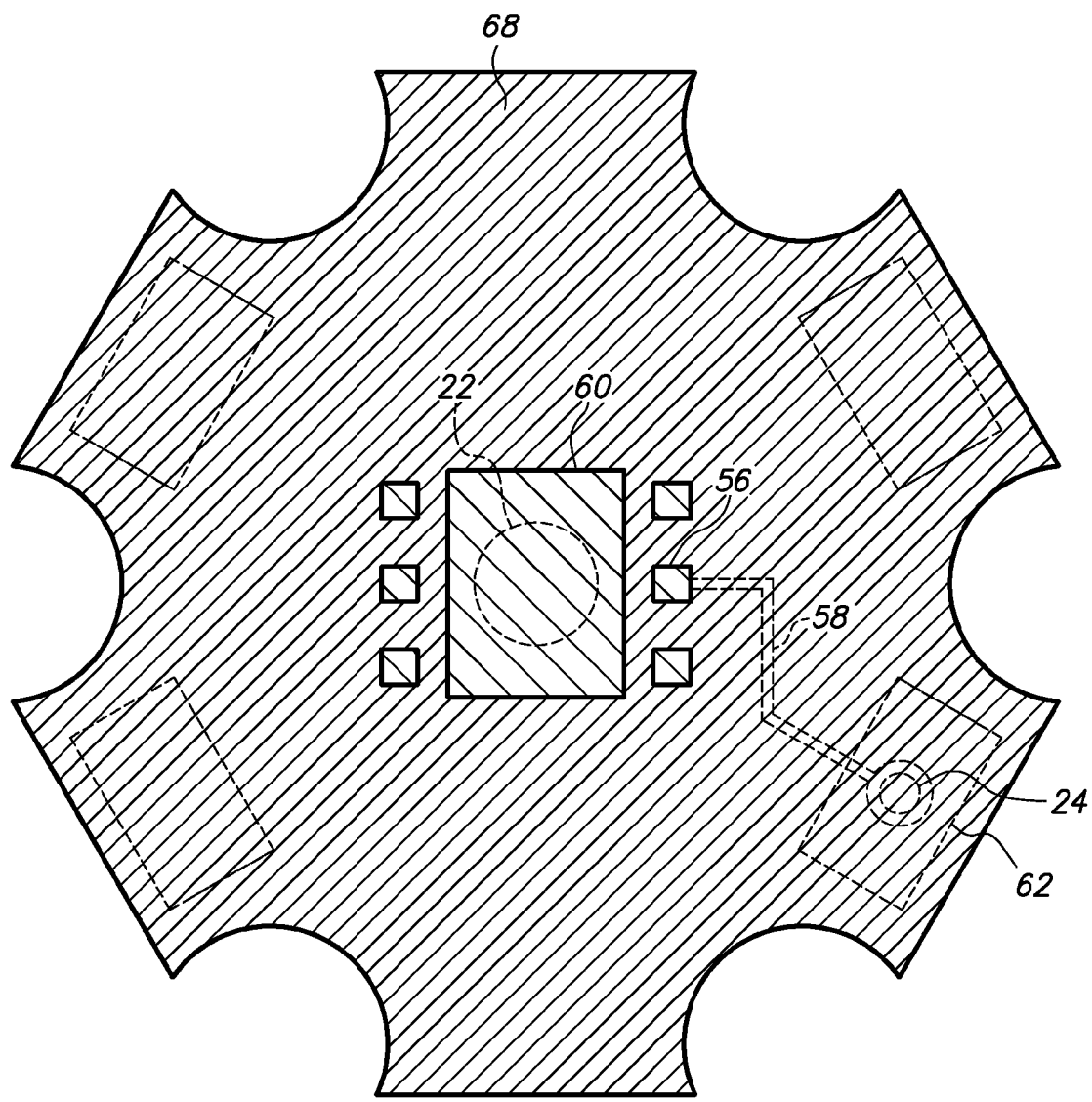
Figure 5C:
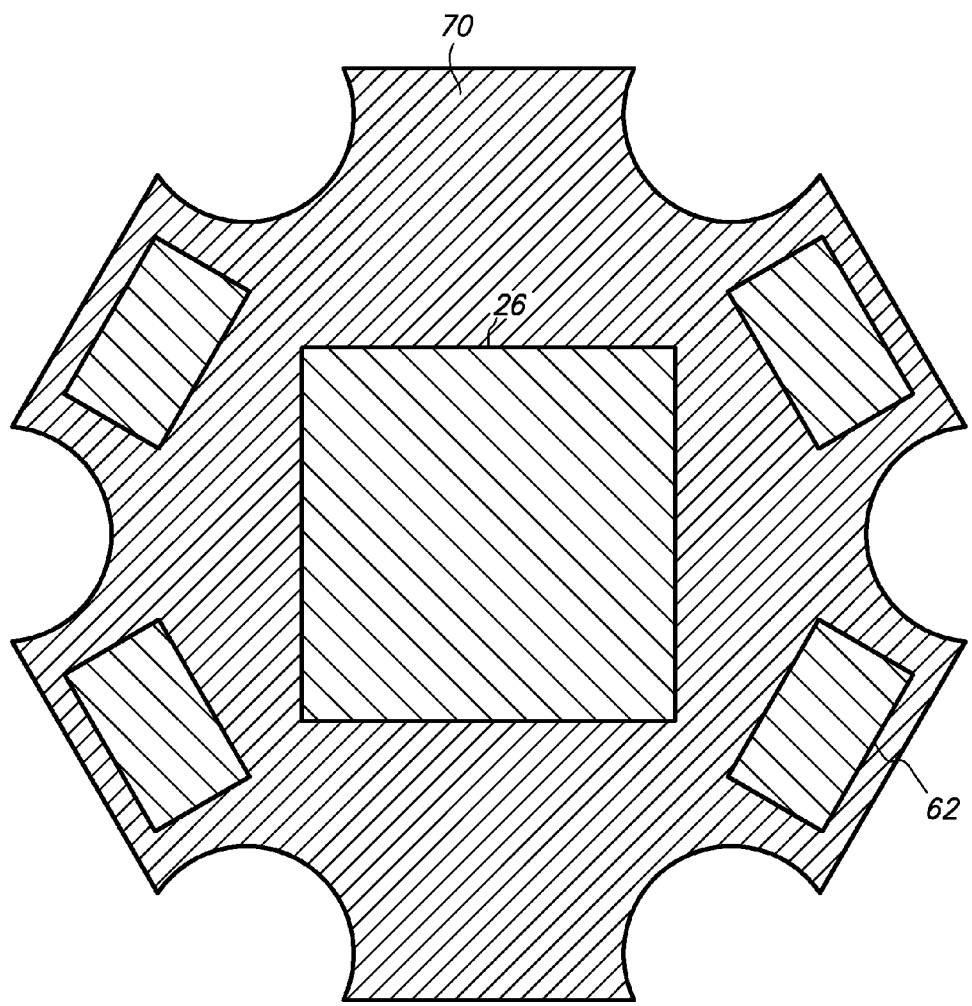

FIGS. 5A, 5B and 5C are cross-sectional, top and bottom views, respectively, of a thermal board with a conductive trace on an adhesive in accordance with an embodiment of the present invention.

In this embodiment, the conductive trace contacts the adhesive and the dielectric layer is omitted. For purposes of brevity, any description of thermal board 74 is incorporated herein insofar as the same is applicable, and the same description need not be repeated. Likewise, elements of the thermal board similar to those in thermal board 74 have corresponding reference numerals.

Thermal board 76 includes adhesive 28, conductive trace 64, heat spreader 66 and solder masks 68 and 70. Conductive trace 64 includes signal post 24, pad 56, routing line 58 and terminal 62. Heat spreader 66 includes thermal post 22, base 26 and cap 60.

Conductive layer 36 is thicker in this embodiment than the previous embodiment. For instance, conductive layer 36 has a thickness of 130 microns (rather than 30 microns) so that it can be handled without warping or wobbling. Pad 56 and routing line 58 are therefore thicker and contact and overlap adhesive 28, and thermal board 76 is devoid of a dielectric layer corresponding to dielectric layer 38.

Thermal board 76 can be manufactured in a manner similar to thermal board 74 with suitable adjustments for thermal post 22, signal post 24 and conductive layer 36. For instance, metal plate 10 has a thickness of 280 microns (rather than 330 microns) so that posts 22 and 24 have a height of 250 microns (rather than 300 microns). This can be accomplished by reducing the etch time. Thereafter, adhesive 28 is mounted on base 26, conductive layer 36 alone is mounted on adhesive 28, heat and pressure are applied to flow and solidify adhesive 28, grinding is applied to planarize the top surface and then conductive layer 50 is deposited on the top surface as previously described. Thereafter, conductive layers 36 and 50 are etched to form pad 56 and routing line 58, conductive layer 50 is etched to form cap 60 and base 26 is etched to form terminal 62, then solder mask 68 is formed on the top surface to selectively expose pad 56 and cap 60 and solder mask 70 is formed on the bottom surface to selectively expose base 26 and terminal 62 and then plated contacts 72 provide a surface finish for base 26, pad 56, cap 60 and terminal 62.

Figure 6A:
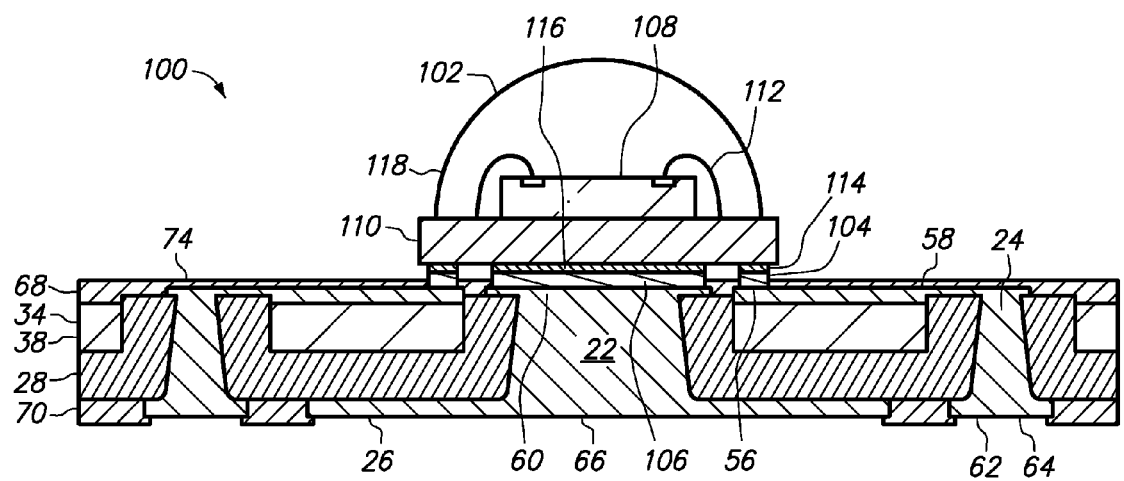
FIGS. 6A, 6B and 6C are cross-sectional, top and bottom views, respectively, of a semiconductor chip assembly that includes a thermal board and an LED package with backside contacts accordance with an embodiment of the present invention.
Figure 6B:
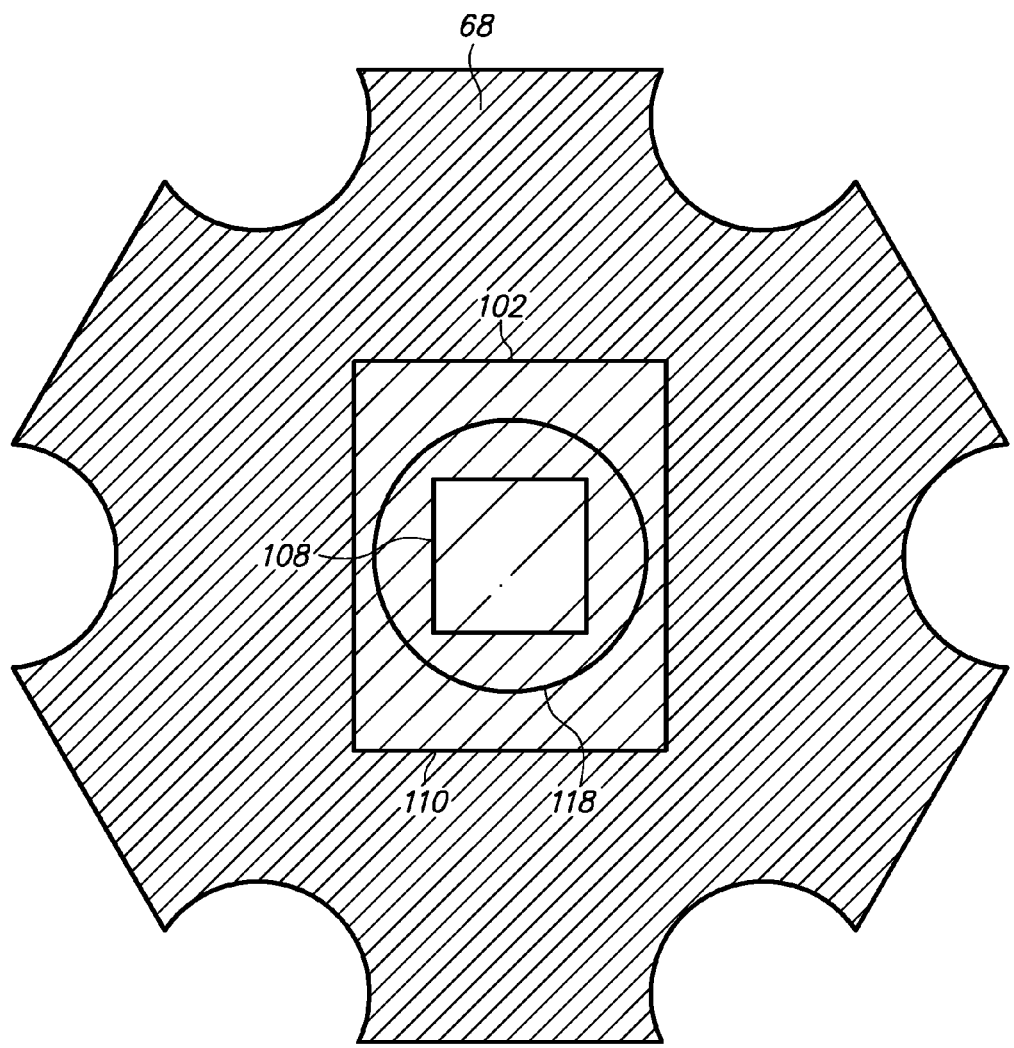
Figure 6C:
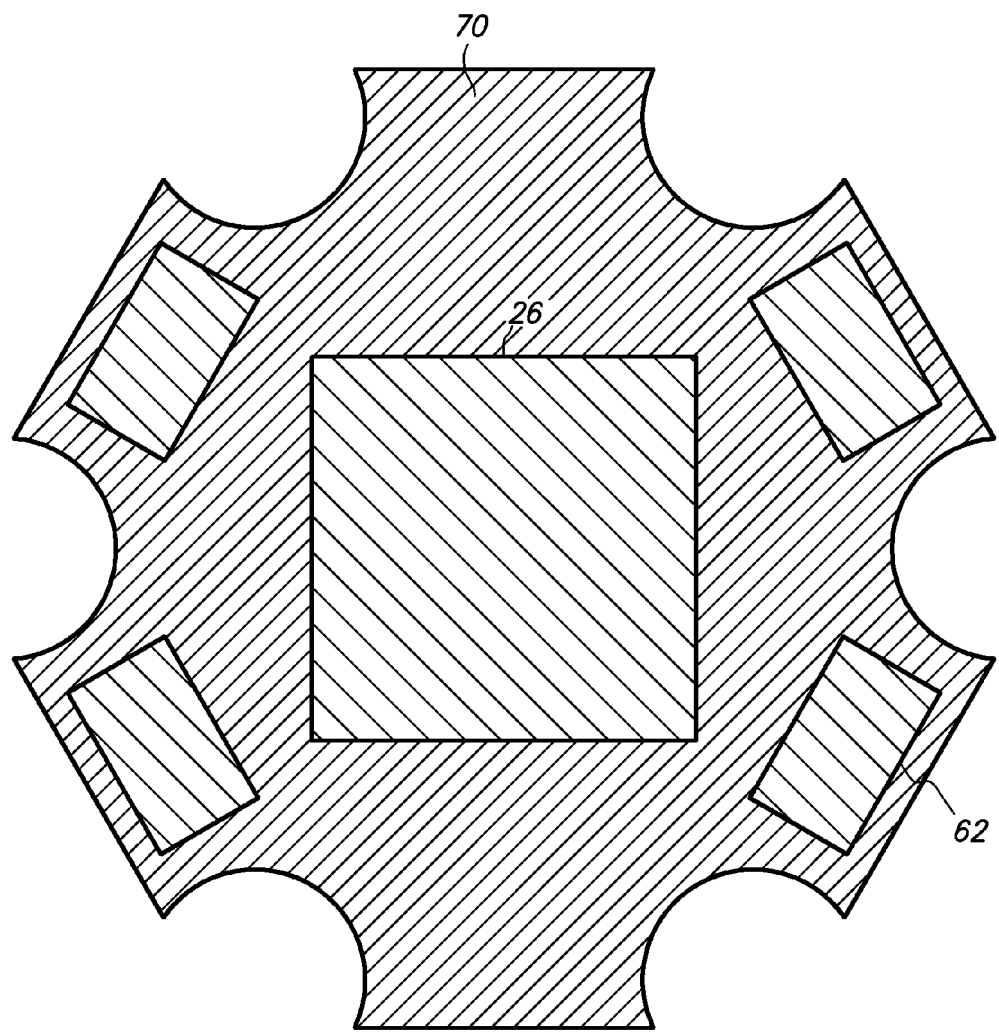

FIGS. 6A, 6B and 6C are cross-sectional, top and bottom views, respectively, of a semiconductor chip assembly that includes a thermal board and an LED package with backside contacts in accordance with an embodiment of the present invention.

Semiconductor chip assembly 100 includes thermal board 74, LED package 102 and solder joints 104 and 106. LED package 102 includes LED chip 108, submount 110, wire bond 112, electrical contact 114, thermal contact 116 and transparent encapsulant 118. LED chip 108 includes an electrode (not shown) electrically connected to a via (not shown) in submount 110 by wire bond 112, thereby electrically connecting LED chip 108 to electrical contact 114. LED chip 108 is mounted on and thermally connected to and mechanically attached to submount 110 by a die attach (not shown), thereby thermally connecting LED chip 108 to thermal contact 116. Submount 110 is a ceramic block with low electrical conductivity and high thermal conductivity, and contacts 114 and 116 are plated on and protrude downwardly from the backside of submount 110.

LED package 102 is mounted on substrate 34 and heat spreader 66, electrically connected to substrate 34 and thermally connected to heat spreader 66. In particular, LED package 102 is mounted on pad 56 and cap 60, overlaps thermal post 22, is electrically connected to substrate 34 by solder joint 104 and is thermally connected to heat spreader 66 by solder joint 106. For instance, solder joint 104 contacts and is sandwiched between and electrically connects and mechanically attaches pad 56 and electrical contact 114, thereby electrically connecting LED chip 108 to terminal 62. Likewise, solder joint 106 contacts and is sandwiched between and thermally connects and mechanically attaches cap 60 and thermal contact 116, thereby thermally connecting LED chip 108 to base 26. Pad 56 is spot plated with nickel/gold to bond well with solder joint 104 and is shaped and sized to match electrical contact 114, thereby improving signal transfer from substrate 34 to LED package 102. Likewise, cap 60 is spot plated with nickel/gold to bond well with solder joint 106 and is shaped and sized to match thermal contact 116, thereby improving heat transfer from LED package 102 to heat spreader 66. Furthermore, thermal post 22 is not and need not be shaped and sized to match thermal contact 116.

Transparent encapsulant 118 is a solid adherent electrically insulative protective plastic enclosure that provides environmental protection such as moisture resistance and particle protection for LED chip 108 and wire bond 112. LED chip 108 and wire bond 112 are embedded in transparent encapsulant 118.

Semiconductor chip assembly 100 can be manufactured by depositing a solder material on pad 56 and cap 60, then placing contacts 114 and 116 on the solder material over pad 56 and cap 60, respectively, and then reflowing the solder material to provide solder joints 104 and 106.

For instance, solder paste is selectively screen printed on pad 56 and cap 60, then LED package 102 is positioned over thermal board 74 using a pick-up head and an automated pattern recognition system in step-and-repeat fashion. The pick-up head places contacts 114 and 116 on the solder paste over pad 56 and cap 60, respectively. Next, the solder paste is heated and reflowed at a relatively low temperature such as 190° C. and then the heat is removed and the solder paste cools and solidifies to form hardened solder joints 104 and 106. Alternatively, solder balls are placed on pad 56 and cap 60, then contacts 114 and 116 are placed on the solder balls over pad 56 and cap 60, respectively, and then the solder balls are heated and reflowed to form solder joints 104 and 106.

The solder material can be initially deposited on thermal board 74 or LED package 102 by plating or printing or placement techniques, then sandwiched between thermal board 74 and LED package 102 and then reflowed. The solder material can also be deposited on terminal 62 if required for the next level assembly. Furthermore, a conductive adhesive such as silver-filled epoxy or other connection media can be used instead of solder, and the connection media on pad 56, cap 60 and terminal 62 need not be the same.

Semiconductor chip assembly 100 is a second-level single-chip module.

Figure 7A:
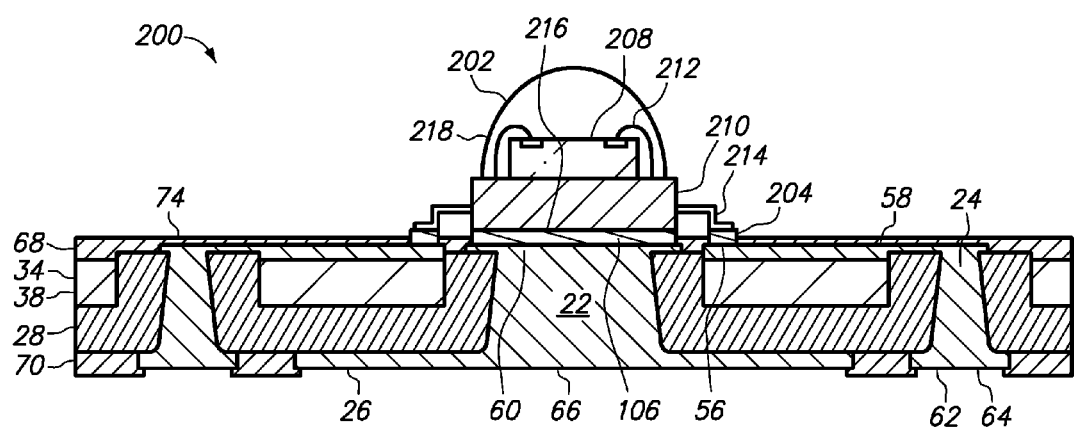
FIGS. 7A, 7B and 7C are cross-sectional, top and bottom views, respectively, of a semiconductor chip assembly that includes a thermal board and an LED package with lateral leads in accordance with an embodiment of the present invention.
Figure 7B:
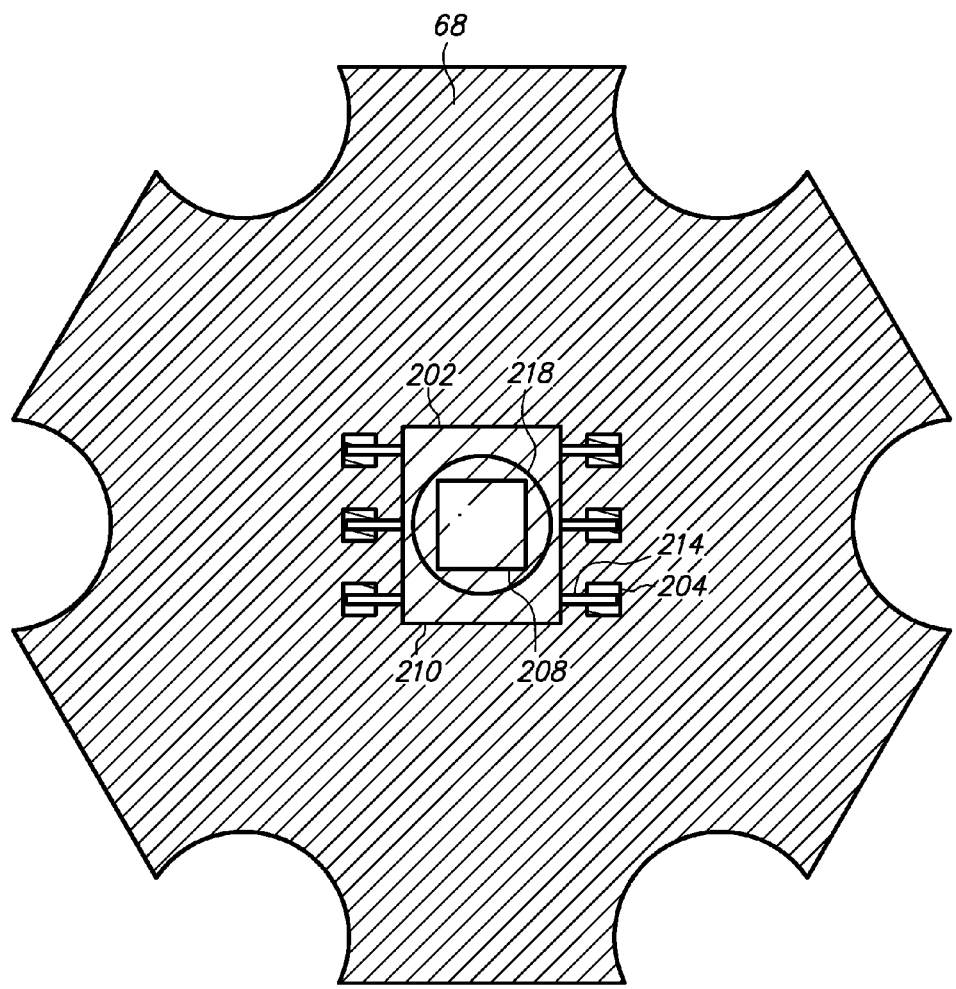
Figure 7C:
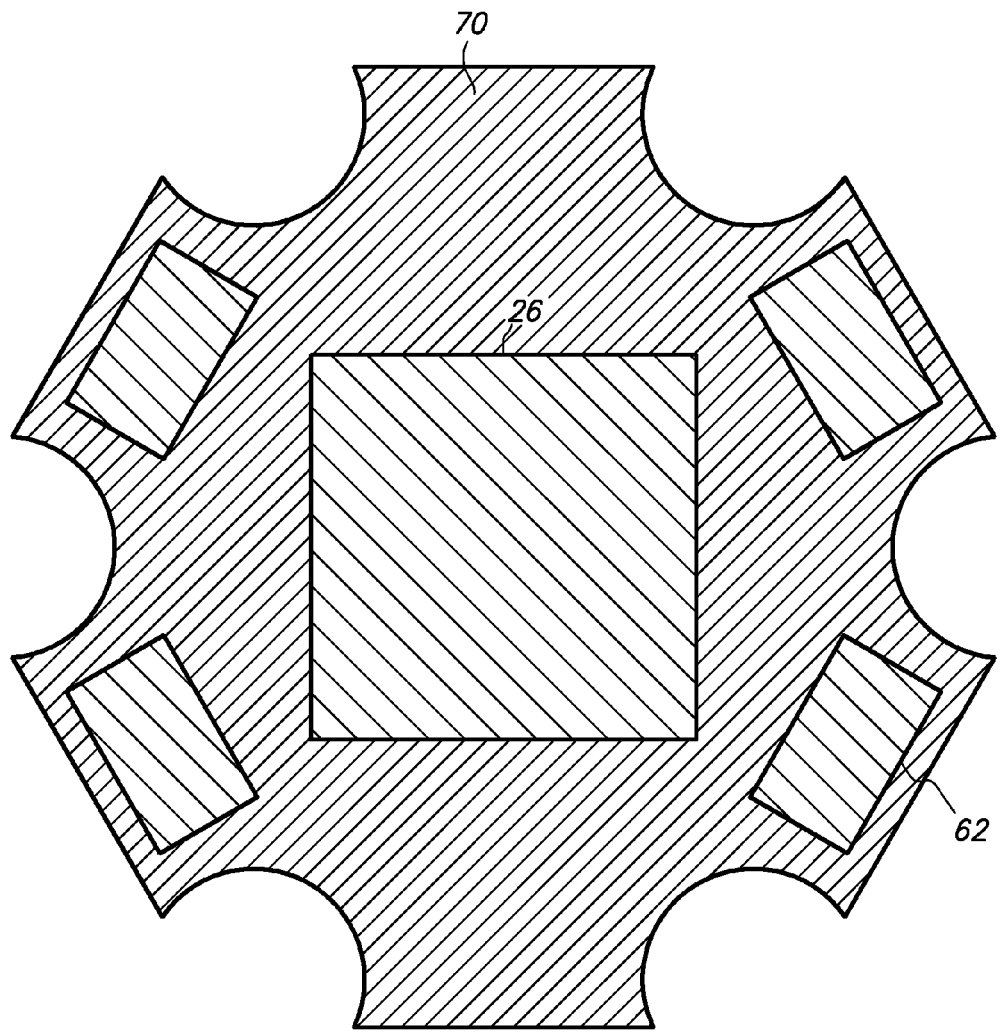

FIGS. 7A, 7B and 7C are cross-sectional, top and bottom views, respectively, of a semiconductor chip assembly that includes a thermal board and an LED package with lateral leads in accordance with an embodiment of the present invention.

In this embodiment, the LED package has lateral leads rather than backside contacts. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 208 corresponds to LED chip 108, submount 210 corresponds to submount 110, etc.

Semiconductor chip assembly 200 includes thermal board 74, LED package 202 and solder joints 204 and 206. LED package 202 includes LED chip 208, submount 210, wire bond 212, lead 214 and transparent encapsulant 218. LED chip 208 is electrically connected to lead 214 by wire bond 212. Submount 210 includes thermal contact surface 216 at its backside, is narrower than submount 110 and has the same lateral size and shape as thermal contact 116. LED chip 208 is mounted on and thermally connected to and mechanically attached to submount 210 by a die attach (not shown), thereby thermally connecting LED chip 208 to thermal contact surface 216. Lead 214 extends laterally from submount 210 and thermal contact surface 216 faces downward.

LED package 202 is mounted on substrate 34 and heat spreader 66, electrically connected to substrate 34 and thermally connected to heat spreader 66. In particular, LED package 202 is mounted on pad 56 and cap 60, overlaps thermal post 22, is electrically connected to substrate 34 by solder joint 204 and is thermally connected to heat spreader 66 by solder joint 206. For instance, solder joint 204 contacts and is sandwiched between and electrically connects and mechanically attaches pad 56 and lead 214, thereby electrically connecting LED chip 208 to terminal 62. Likewise, solder joint 206 contacts and is sandwiched between and thermally connects and mechanically attaches cap 60 and thermal contact surface 216, thereby thermally connecting LED chip 208 to base 26.

Semiconductor chip assembly 200 can be manufactured by depositing a solder material on pad 56 and cap 60, then placing lead 214 and thermal contact surface 216 on the solder material over pad 56 and cap 60, respectively, and then reflowing the solder material to provide solder joints 204 and 206.

Semiconductor chip assembly 200 is a second-level single-chip module.

Figure 8A:
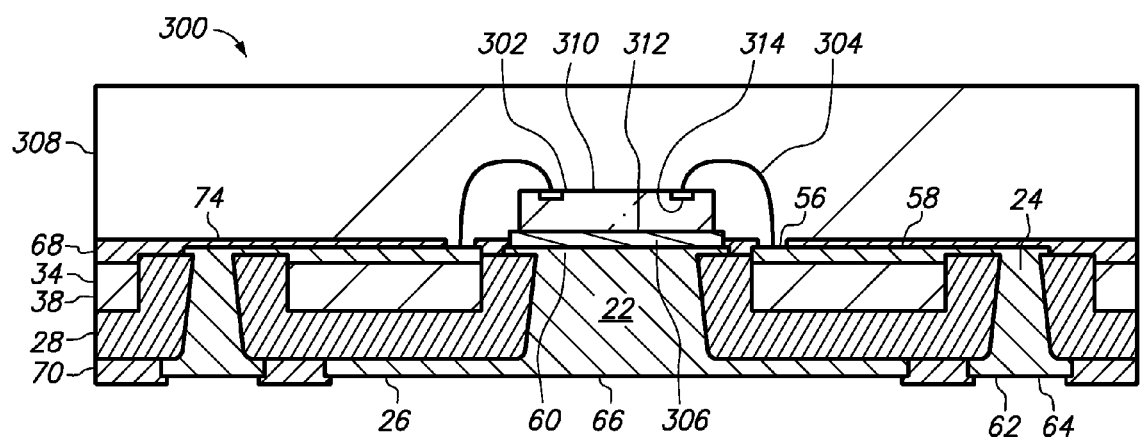
FIGS. 8A, 8B and 8C are cross-sectional, top and bottom views, respectively, of a semiconductor chip assembly that includes a thermal board and a semiconductor chip in accordance with an embodiment of the present invention.
Figure 8B:
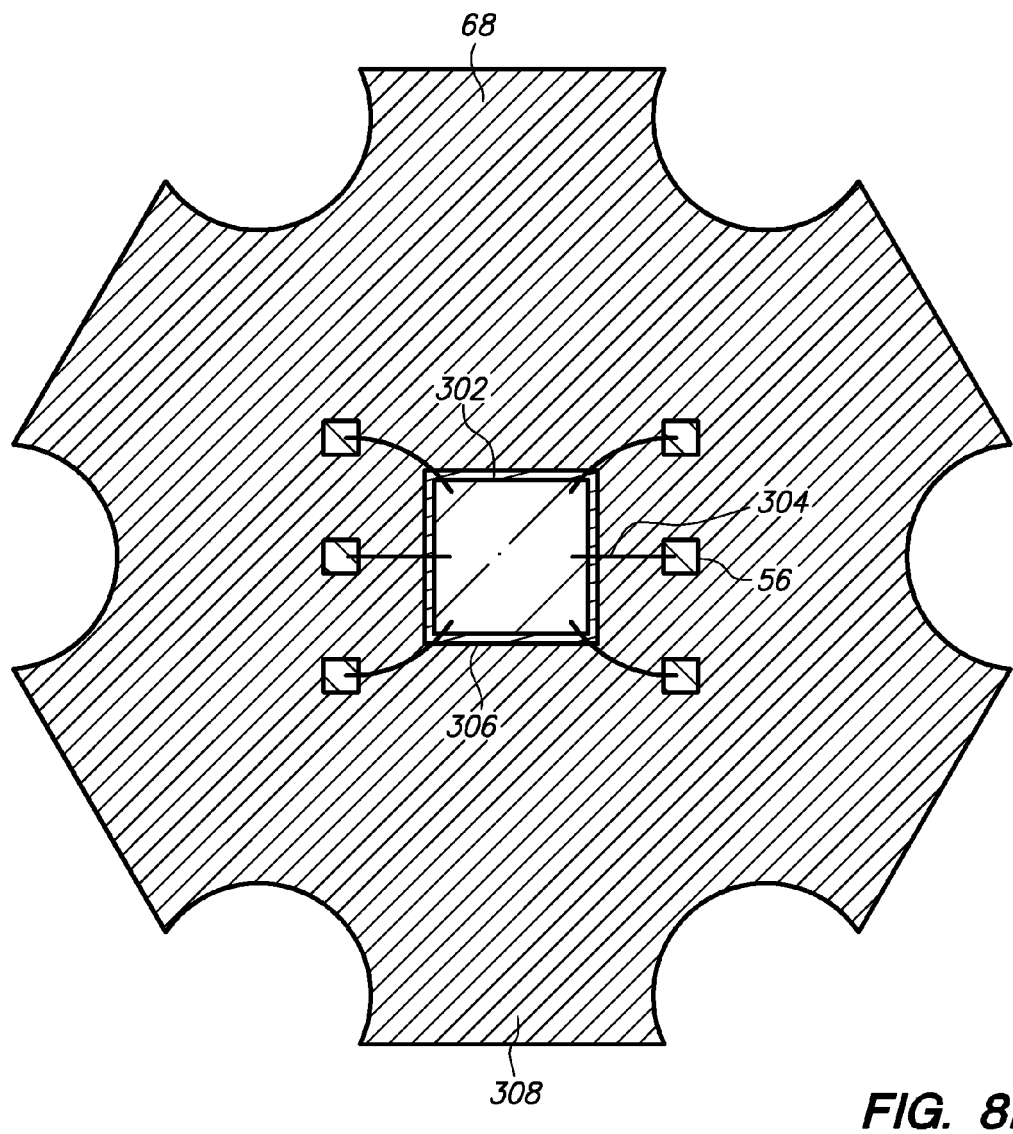
Figure 8C:
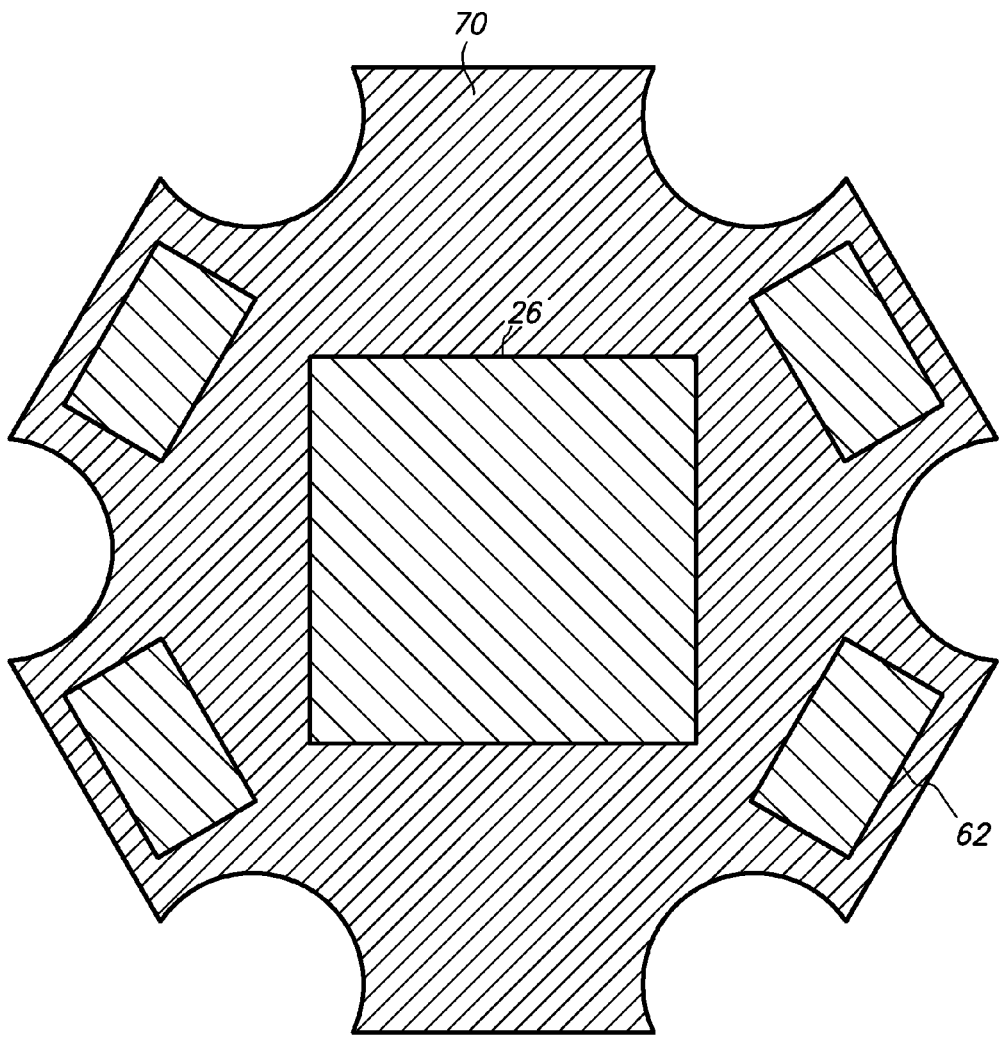

FIGS. 8A, 8B and 8C are cross-sectional, top and bottom views, respectively, of a semiconductor chip assembly that includes a thermal board and a semiconductor chip in accordance with an embodiment of the present invention.

In this embodiment, the semiconductor device is a chip rather than a package and the chip is mounted on the heat spreader but not the substrate. Furthermore, the chip overlaps the thermal post but not the substrate, is electrically connected to the pad using a wire bond and is thermally connected to the cap using a die attach.

Semiconductor chip assembly 300 includes thermal board 74, chip 302, wire bond 304, die attach 306 and encapsulant 308. Chip 302 includes top surface 310, bottom surface 312 and bond pad 314. Top surface 310 is the active surface and includes bond pad 314 and bottom surface 312 is the thermal contact surface.

Chip 302 is mounted on heat spreader 66, electrically connected to substrate 34 and thermally connected to heat spreader 66. In particular, chip 302 is mounted on cap 60, is within the periphery of cap 60, overlaps thermal post 22 but does not overlap substrate 34, is electrically connected to substrate 34 by wire bond 304 and is thermally connected to and mechanically attached to heat spreader 66 by die attach 306. For instance, wire bond 304 is bonded to and electrically connects pads 56 and 314, thereby electrically connecting chip 302 to terminal 62. Likewise, die attach 306 contacts and is sandwiched between and thermally connects and mechanically attaches cap 60 and thermal contact surface 312, thereby thermally connecting chip 302 to base 26. Pad 56 is spot plated with nickel/silver to bond well with wire bond 304, thereby improving signal transfer from substrate 34 to chip 302, and cap 60 is shaped and sized to match thermal contact surface 312, thereby improving heat transfer from chip 302 to heat spreader 66. Furthermore, thermal post 22 is not and need not be shaped and sized to match thermal contact surface 312.

Encapsulant 308 is a solid adherent electrically insulative protective plastic enclosure that provides environmental protection such as moisture resistance and particle protection for chip 302 and wire bond 304. Chip 302 and wire bond 304 are embedded in encapsulant 308. Furthermore, encapsulant 308 can be transparent if chip 302 is an optical chip such as an LED. Encapsulant 308 is transparent in FIG. 8B for convenience of illustration.

Semiconductor chip assembly 300 can be manufactured by mounting chip 302 on cap 60 using die attach 306, then wire bonding pads 56 and 314 and then forming encapsulant 308.

For instance, die attach 306 is initially a silver-filled epoxy paste with high thermal conductivity that is selectively screen printed on cap 60 and then chip 302 placed on the epoxy paste using a pick-up head and an automated pattern recognition system in step-and-repeat fashion. Thereafter, the epoxy paste is heated and hardened at a relatively low temperature such as 190° C. to form die attach 306. Next, wire bond 304 is a gold wire that is thermosonically ball bonded to pads 56 and 314 and then encapsulant 308 is transfer molded on the structure.

Chip 302 can be electrically connected to pad 56 by a wide variety of connection media, thermally connected to and mechanically attached to heat spreader 66 by a wide variety of thermal adhesives and encapsulated by a wide variety of encapsulants.

Semiconductor chip assembly 300 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the substrate can include single-level conductive traces and multi-level conductive traces. The thermal board can include multiple posts arranged in an array for multiple semiconductor devices and can include additional conductive traces to accommodate the additional semiconductor devices. Likewise, the semiconductor device can be an LED package with multiple LED chips and the thermal board can include additional conductive traces to accommodate the additional LED chips. The semiconductor device and the cap can overlap the substrate and cover the thermal post in the upward direction.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the thermal post and the substrate can include additional conductive traces to receive and route additional wire bonds to the chips. This may be more cost effective than providing a miniature thermal post for each chip.

The semiconductor chip can be optical or non-optical. For instance, the chip can be an LED, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a thermal post and base that are integral with one another and a cap that is metallurgically bonded and thermally connected to the thermal post, thereby enhancing reliability and reducing cost. The cap can be coplanar with the pad, thereby facilitating the electrical, thermal and mechanical connections with the semiconductor device. Furthermore, the cap can be customized for the semiconductor device and the base can be customized for the next level assembly, thereby enhancing the thermal connection from the semiconductor device to the next level assembly. For instance, the thermal post can have a circular shape in a lateral plane and the cap can have a square or rectangular shape in a lateral plane with the same or similar topography as the thermal contact of the semiconductor device.

The heat spreader can be electrically connected to or isolated from the semiconductor device and the substrate. For instance, the second conductive layer on the grinded surface can include a routing line that extends across the adhesive between the substrate and the cap and electrically connects the semiconductor device to the heat spreader. Thereafter, the heat spreader can be electrically connected to ground, thereby electrically connecting the semiconductor device to ground.

The heat spreader can be copper, aluminum, copper/nickel/aluminum or other thermally conductive metallic structures.

The thermal post can be deposited on or integral with the base. The thermal post can be integral with the base when they are a single-piece metal such as copper or aluminum. The thermal post can also be integral with the base when they include a single-piece metal such as copper at their interface as well as additional metal elsewhere such as a solder upper post portion and a copper lower post portion and base. The thermal post can also be integral with the base when they share single-piece metals at their interface such as a copper coating on a nickel buffer layer on an aluminum core.

The signal post can be deposited on or integral with the terminal. The signal post can be integral with the terminal when they are a single-piece metal such as copper or aluminum. The signal post can also be integral with the terminal when they include a single-piece metal such as copper at their interface as well as additional metal elsewhere such as a solder upper post portion and a copper lower post portion and terminal. The signal post can also be integral with the terminal when they share single-piece metals at their interface such as a copper coating on a nickel buffer layer on an aluminum core.

The thermal post can include a flat top surface that is coplanar with the adhesive. For instance, the thermal post can be coplanar with the adhesive or the thermal post can be etched after the adhesive is solidified to provide a cavity in the adhesive over the thermal post. The thermal post can also be selectively etched to provide a cavity in the thermal post that extends below its top surface. In any case, the semiconductor device can be mounted on the thermal post and located in the cavity, and the wire bond can extend from the semiconductor device in the cavity to the pad outside the cavity. In this instance, the semiconductor device can be an LED chip and the cavity can focus the LED light in the upward direction.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its bottom surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified, either before, during or after the pad and/or the terminal is formed. The cap can be the same metal as the thermal post or the adjacent top of the thermal post. Furthermore, the cap can extend across the aperture to the substrate or reside within the periphery of the aperture. Thus, the cap may contact or be spaced from the substrate. In any case, the cap extends laterally from the top of the thermal post in the lateral directions.

The adhesive can provide a robust mechanical bond between the heat spreader and the substrate. For instance, the adhesive can extend laterally from the thermal post beyond the conductive trace to the peripheral edges of the assembly, the adhesive can fill the space between the heat spreader and the substrate and the adhesive can be void-free with consistent bond lines. The adhesive can also absorb thermal expansion mismatch between the heat spreader and the substrate. Furthermore, the adhesive can be a low cost dielectric that need not have high thermal conductivity. Moreover, the adhesive is not prone to delamination.

The adhesive thickness can be adjusted so that the adhesive essentially fills the gaps and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the apertures can be formed in the conductive layer and then the conductive layer can be mounted on the adhesive so that the conductive layer contacts the adhesive and is exposed in the upward direction and the posts extend into and are exposed in the upward direction by the apertures. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the apertures can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the posts extend into and are exposed in the upward directions by the apertures. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the apertures can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the posts are aligned with the apertures and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned to provide the conductive trace. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the cap can be coplanar at their top surfaces, thereby enhancing solder joints between the semiconductor device and the thermal board by controlling solder ball collapse.

The pad and the routing line over the dielectric layer can be formed by numerous deposition techniques including electroplating, electroless plating, evaporating and sputtering as a single layer or multiple layers, either before or after the substrate is mounted on the adhesive. For instance, the conductive layer can be patterned on the substrate before it is mounted on the adhesive or after it is attached to the posts and the base by the adhesive.

The plated contact surface finish can be formed before or after the pad and the terminal are formed. For instance, the plated layer can be deposited on the base and the second conductive layer and then patterned using the etch masks that define the pad and the terminal.

The conductive trace can include additional pads, terminals, vias, signal posts and routing lines as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The cap, dielectric layer, solder masks, plated contacts and second conductive layer on the grinded surface are generally desirable but may be omitted in some embodiments. For instance, if the opening and aperture are punched rather than drilled so that the top of the thermal post is shaped and sized to accommodate a thermal contact surface of the semiconductor device then the cap and the second conductive layer may be omitted to reduce cost. Likewise, the dielectric layer may be omitted to reduce cost.

The thermal board can include a thermal via that is spaced from the posts, extends through the dielectric layer and the adhesive outside the openings and the apertures and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single top and bottom solder mask and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single top and bottom solder mask.

For example, multiple recesses can be etched in the metal plate to form multiple thermal posts and signal posts and the base, then the non-solidified adhesive with openings corresponding to the posts can be mounted on the base such that each post extends through an opening, then the substrate (with a single conductive layer, a single dielectric layer and apertures corresponding to the posts) can be mounted on the adhesive such that each post extends through an opening into an aperture, then the base and the substrate can be moved towards one another by platens to force the adhesive into the gaps in the apertures between the posts and the substrate, then the adhesive can be cured and solidified, then the posts, the adhesive and the first conductive layer can be grinded to form a lateral top surface, then the second conductive layer can be plated on the posts, the adhesive and the first conductive layer, then the first and second conductive layers can be etched to form the pads and the routing lines corresponding to the signal posts, the second conductive layer can be etched to form the caps corresponding to the thermal posts and the base can be etched to form the bases corresponding to the thermal posts and the terminals corresponding to the signal posts, then the top solder mask can be deposited on the structure and patterned to expose the pads and the caps and the bottom solder mask can be deposited on the structure and patterned to expose the bases and the terminals, then the plated contact surface finish can be formed on the bases, the pads, the terminals and the caps and then the substrate, the adhesive and the solder masks can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the caps, then the LED packages can be placed on the solder paste portions, then the solder paste portions can be simultaneously heated, reflowed and hardened to provide the solder joints, and then the thermal boards can be separated from one another.

As another example, die attach paste portions can be deposited on the caps, then the chips can be placed on the die attach paste portions, then the die attach paste portions can be simultaneously heated and hardened to provide the die attaches, then the chips can be wired bonded to the corresponding pads, then the encapsulant can be formed over the chips and the wire bonds, and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the thermal post is adjacent to the base regardless of whether the thermal post is formed additively or subtractively.

The term "overlap" refers to above and extending within a periphery of an underlying element. Overlap includes extending inside and outside the periphery or residing within the periphery. For instance, the semiconductor device overlaps the thermal post since an imaginary vertical line intersects the semiconductor device and the thermal post, regardless of whether another element such as the cap is between the semiconductor device and the thermal post and is intersected by the line, and regardless of whether another imaginary vertical line intersects the semiconductor device but not the thermal post (outside the periphery of the thermal post). Likewise, the adhesive overlaps the base and is overlapped by the pad, and the base is overlapped by the thermal post. Likewise, the thermal post overlaps and is within a periphery of the base. Moreover, overlap is synonymous with over and overlapped by is synonymous with under or beneath.

The term "contact" refers to direct contact. For instance, the dielectric layer contacts the pad but does not contact the thermal post or the base.

The term "cover" refers to complete coverage in the upward, downward and/or lateral directions. For instance, the base covers the thermal post in the downward direction but the thermal post does not cover the base in the upward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "cap" in conjunction with the heat spreader refers to a contact region that is adapted to contact and/or bond to external connection media (such as solder or thermally conductive adhesive) that thermally connects the heat spreader to the semiconductor device.

The terms "opening" and "aperture" refer to a through-hole and are synonymous. For instance, the thermal post is exposed by the adhesive in the upward direction when it is inserted into the opening in the adhesive. Likewise, the thermal post is exposed by the substrate in the upward direction when it is inserted into the aperture in the substrate.

The term "inserted" refers to relative motion between elements. For instance, the thermal post is inserted into the aperture regardless of whether the thermal post is stationary and the substrate moves towards the base, the substrate is stationary and the thermal post moves towards the substrate or the thermal post and the substrate both approach the other. Furthermore, the thermal post is inserted (or extends) into the aperture regardless of whether it goes through (enters and exits) or does not go through (enters without exiting) the aperture.

The phrase "move towards one another" also refers to relative motion between elements. For instance, the base and the substrate move towards one another regardless of whether the base is stationary and the substrate moves towards the base, the substrate is stationary and the base moves towards the substrate or the base and the substrate both approach the other.

The phrase "aligned with" refers to relative position between elements. For instance, the thermal post is aligned with the aperture when the adhesive is mounted on the base, the substrate is mounted on the adhesive, the thermal post is inserted into and aligned with the opening and the aperture is aligned with the opening regardless of whether the thermal post is inserted into the aperture or is below and spaced from the aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach. Likewise, the semiconductor device is mounted on the heat spreader regardless of whether it is mounted on the heat spreader alone or the heat spreader and the substrate.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the thermal post and the dielectric layer in the gap refers to the adhesive in the gap that contacts and is sandwiched between the thermal post at the inner sidewall of the gap and the dielectric layer at the outer sidewall of the gap.

The term "above" refers to upward extension and includes adjacent and non-adjacent elements as well as overlapping and non-overlapping elements. For instance, the thermal post extends above, is adjacent to, overlaps and protrudes from the base. Likewise, the thermal post extends above the dielectric layer even though it is not adjacent to or overlap the dielectric layer.

The term "below" refers to downward extension and includes adjacent and non-adjacent elements as well as overlapping and non-overlapping elements. For instance, the base extends below, is adjacent to, is overlapped by and protrudes from the thermal post. Likewise, the thermal post extends below the dielectric layer even though it is not adjacent to or overlapped by the dielectric layer.

The "upward" and "downward" vertical directions do not depend on the orientation of the semiconductor chip assembly (or the thermal board), as will be readily apparent to those skilled in the art. For instance, the thermal post extends vertically above the base in the upward direction and the adhesive extends vertically below the pad in the downward direction regardless of whether the assembly is inverted and/or mounted on a heat sink. Likewise, the base extends "laterally" from the thermal post in a lateral plane regardless of whether the assembly is inverted, rotated or slanted. Thus, the upward and downward directions are opposite one another and orthogonal to the lateral directions, and laterally aligned elements are coplanar with one another at a lateral plane orthogonal to the upward and downward directions.

The semiconductor chip assembly of the present invention has numerous advantages. The assembly is reliable, inexpensive and well-suited for high volume manufacture. The assembly is especially well-suited for high power semiconductor devices such as LED packages and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
   a semiconductor device;
   an adhesive that includes first and second openings;
   a heat spreader that includes a thermal post and a base,
      wherein the thermal post is adjacent to and integral with the base and extends above the base in an upward direction, and the base extends below the thermal post in a downward direction opposite the upward direction, covers the thermal post in the downward direction and extends laterally from the thermal post in lateral directions orthogonal to the upward and downward directions; and a conductive trace that includes a pad, a terminal and a signal post, wherein the signal post extends below the pad and above the terminal and an electrically conductive path between the pad and the terminal includes the signal post;

wherein the semiconductor device is mounted on the heat spreader, overlaps the thermal post, is electrically connected to the pad and thereby electrically connected to the terminal, and is thermally connected to the thermal post and thereby thermally connected to the base;

wherein the adhesive is mounted on and extends above the base, contacts the posts, the base and the terminal and extends laterally from the thermal post to or beyond the terminal;

wherein the pad extends above the posts and the adhesive and the terminal extends below the posts; and wherein the thermal post extends into the first opening, the signal post extends into the second opening, the posts have the same thickness and are coplanar with one another between top and bottom surfaces of the pad and are the same metallic material as one another, and the base and the terminal have the same thickness and are coplanar with one another below the posts and are the same metallic material as one another.

2. The assembly of claim 1, wherein the semiconductor device is an LED package that includes an LED chip.

3. The assembly of claim 2, wherein the LED package is electrically connected to the pad using a first solder joint and is thermally connected to the heat spreader using a second solder joint.

4. The assembly of claim 1, wherein the semiconductor device is a semiconductor chip.

5. The assembly of claim 4, wherein the chip is electrically connected to the pad using a wire bond and is thermally connected to the heat spreader using a die attach.

6. The assembly of claim 1, wherein the adhesive is a solidified prepreg.

7. The assembly of claim 1, wherein the adhesive covers and surrounds the posts in the lateral directions.

8. The assembly of claim 1, wherein the adhesive conformally coats sidewalls of the posts.

9. The assembly of claim 1, wherein the adhesive is coplanar with tops and bottoms of the posts.

10. The assembly of claim 1, wherein the adhesive extends laterally from the thermal post beyond the terminal.

11. The assembly of claim 1, wherein the adhesive extends to peripheral edges of the assembly.

12. The assembly of claim 1, wherein the thermal post fills and is contained within the first opening, the signal post fills and is contained within the second opening and the posts are copper.

13. The assembly of claim 1, wherein the thermal post has a diameter that decreases as it extends upwardly from the base to its flat top, and the signal post has a diameter that decreases as it extends upwardly from the terminal to its flat top.

14. The assembly of claim 1, wherein the posts are coplanar with the adhesive between the top and bottom surfaces of the pad.

15. The assembly of claim 1, wherein the base covers the semiconductor device in the downward direction, supports the adhesive and is spaced from peripheral edges of the assembly.

16. The assembly of claim 1, wherein the terminal is adjacent to and integral with the signal post, covers the signal post in the downward direction and extends laterally from the signal post in the lateral directions.

17. The assembly of claim 1, wherein the heat spreader includes a cap that extends above and is adjacent to and covers in the upward direction and extends laterally in the lateral directions from a top of the thermal post and that contacts and overlaps the adhesive.

18. The assembly of claim 17, wherein the cap is coplanar with the pad above the posts and the adhesive and has a different thickness than the pad where the cap is adjacent to the thermal post.

19. The assembly of claim 17, wherein the cap has a rectangular or square shape and the top of the thermal post has a circular shape.

20. The assembly of claim 17, wherein the posts are copper and the base, the cap, the pad and the terminal are primarily copper.

21. A semiconductor chip assembly, comprising:
a semiconductor device;
an adhesive that includes first and second openings;
a heat spreader that includes a thermal post and a base, wherein the thermal post is adjacent to and integral with the base and extends above the base in an upward direction, the base extends below the thermal post in a downward direction opposite the upward direction, covers the thermal post in the downward direction and extends laterally from the thermal post in lateral directions orthogonal to the upward and downward directions; and
a conductive trace that includes a pad, a terminal, a routing line and a signal post, wherein the routing line is adjacent to the pad and the signal post and overlaps the signal post, the signal post is adjacent to and integral with the terminal, extends below the pad and the routing line and extends above the terminal, the terminal covers the signal post in the downward direction and extends laterally from the signal post in the lateral directions and an electrically conductive path between the pad and the terminal includes the routing line and the signal post;
wherein the semiconductor device is mounted on the heat spreader, overlaps the thermal post, does not overlap the signal post, is electrically connected to the pad and thereby electrically connected to the terminal, and is thermally connected to the thermal post and thereby thermally connected to the base;
wherein the adhesive is mounted on and extends above the base, contacts the posts, the base and the terminal, covers and surrounds the posts in the lateral directions, extends laterally from the thermal post to or beyond the terminal and extends to peripheral edges of the assembly;
wherein the pad extends above the posts and the adhesive; and
wherein the thermal post fills and is contained within the first opening, the signal post fills and is contained within the second opening, the posts have the same thickness and are coplanar with one another and with the adhesive between top and bottom surfaces of the pad and are a metal, and the base and the terminal have the same thickness and are coplanar with one another below the posts and the adhesive and are the same metallic material and include the metal.

22. The assembly of claim 21, wherein the semiconductor device is a semiconductor chip, is mounted on the heat spreader using a die attach, is electrically connected to the pad using a wire bond and is thermally connected to the heat spreader using the die attach.

23. The assembly of claim 21, wherein the thermal post has a diameter that decreases as it extends upwardly from the base to the cap, and the signal post has a diameter that decreases as it extends upwardly from the terminal to the routing line.

24. The assembly of claim 21, wherein a cap extends above and is adjacent to and covers in the upward direction and extends laterally in the lateral directions from the top of the thermal post and contacts and overlaps the adhesive.

25. The assembly of claim 24, wherein the cap is coplanar with the pad above the posts and the adhesive and has a different thickness than the pad where the cap is adjacent to the thermal post.

26. A semiconductor chip assembly, comprising:
a semiconductor device;
an adhesive that includes first and second openings;
a heat spreader that includes a thermal post and a base, wherein the thermal post is adjacent to and integral with the base and extends above the base in an upward direction, and the base extends below the thermal post in a downward direction opposite the upward direction, covers the thermal post in the downward direction and extends laterally from the thermal post in lateral directions orthogonal to the upward and downward directions;
a substrate that includes a dielectric layer, wherein first and second apertures extend through the substrate; and
a conductive trace that includes a pad, a terminal and a signal post, wherein the signal post extends below the pad and above the terminal and an electrically conductive path between the pad and the terminal includes the signal post;
wherein the semiconductor device is mounted on the heat spreader, overlaps the thermal post, is electrically connected to the pad and thereby electrically connected to the terminal, and is thermally connected to the thermal post and thereby thermally connected to the base;
wherein the adhesive is mounted on and extends above the base, extends through a first gap in the first aperture between the thermal post and the substrate and through a second gap in the second aperture between the signal post and the substrate, extends across the dielectric layer in the gaps, contacts the thermal post and the dielectric layer in the first gap, contacts the signal post and the dielectric layer in the second gap, contacts the base, the terminal and the dielectric layer outside the gaps, extends laterally from the thermal post to or beyond the terminal and is sandwiched between the thermal post and the dielectric layer, between the signal post and the dielectric layer and between the base and the dielectric layer;
wherein the substrate is mounted on the adhesive and extends above the base;
wherein the pad extends above the posts, the adhesive and the dielectric layer; and
wherein the thermal post extends into the first opening and the first aperture and above and below the dielectric layer, the signal post extends into the second opening and the second aperture and above and below the dielectric layer, the posts have the same thickness and are coplanar with one another between top and bottom surfaces of the pad and are the same metallic material as one another, the base and the terminal have the same thickness and are coplanar with one another below the posts, the adhesive and the dielectric layer and are the same metallic material as one another, and the base extends below the semiconductor device and the pad.

27. The assembly of claim 26, wherein the semiconductor device is an LED package that includes an LED chip.

28. The assembly of claim 27, wherein the LED package is electrically connected to the pad using a first solder joint and is thermally connected to the heat spreader using a second solder joint.

29. The assembly of claim 26, wherein the semiconductor device is a semiconductor chip.

30. The assembly of claim 29, wherein the chip is electrically connected to the pad using a wire bond and is thermally connected to the heat spreader using a die attach.

31. The assembly of claim 26, wherein the adhesive is a solidified prepreg.

32. The assembly of claim 26, wherein the adhesive covers and surrounds the posts in the lateral directions.

33. The assembly of claim 26, wherein the adhesive conformally coats sidewalls of the posts.

34. The assembly of claim 26, wherein the adhesive is coplanar with tops and bottoms of the posts.

35. The assembly of claim 26, wherein the adhesive extends laterally from the thermal post beyond the terminal.

36. The assembly of claim 26, wherein the adhesive extends to peripheral edges of the assembly.

37. The assembly of claim 26, wherein the thermal post fills and is contained within the first opening, the signal post fills and is contained within the second opening, the thermal post and the adhesive in combination fill the first aperture, the signal post and the adhesive in combination fill the second aperture and the posts are copper.

38. The assembly of claim 26, wherein the thermal post has a diameter that decreases as it extends upwardly from the base to its flat top, and the signal post has a diameter that decreases as it extends upwardly from the terminal to its flat top.

39. The assembly of claim 26, wherein the posts are coplanar with the adhesive between the top and bottom surfaces of the pad.

40. The assembly of claim 26, wherein the posts are copper and the base, the pad and the terminal are primarily copper.

41. The assembly of claim 26, wherein the terminal is adjacent to and integral with the signal post, covers the signal post in the downward direction and extends laterally from the signal post in the lateral directions.

42. The assembly of claim 26, wherein the heat spreader includes a cap that extends above and is adjacent to and covers in the upward direction and extends laterally in the lateral directions from the top of the thermal post and that contacts and overlaps the adhesive and the dielectric layer.

43. The assembly of claim 42, wherein the cap is coplanar with the pad above the posts, the adhesive and the dielectric layer and has a different thickness than the pad where the cap is adjacent to the thermal post.

44. The assembly of claim 42, wherein the cap has a rectangular or square shape and the top of the thermal post has a circular shape.

45. The assembly of claim 42, wherein the posts are copper and the base, the cap, the pad and the terminal are primarily copper.

46. A semiconductor chip assembly, comprising:
a semiconductor device;
an adhesive that includes first and second openings;
a heat spreader that includes a thermal post, a base and a cap, wherein the thermal post is adjacent to and integral with the base, extends above the base in an upward direction and thermally connects the base and the cap, the base extends below the thermal post in a downward direction opposite the upward direction, covers the thermal post in the downward direction and extends laterally from the thermal post in lateral directions orthogonal to the upward and downward directions, and the cap extends above and is adjacent to and covers in the upward direction and extends laterally in the lateral directions from a top of the thermal post;

a substrate that includes a dielectric layer, wherein first and second apertures extend through the substrate;

a conductive trace that includes a pad, a routing line, a terminal and a signal post, wherein the routing line is adjacent to the pad and the signal post and overlaps the signal post, the signal post is adjacent to and integral with the terminal, extends below the pad and the routing line and extends above the terminal, the terminal covers the signal post in the downward direction and extends laterally from the signal post in the lateral directions and an electrically conductive path between the pad and the terminal includes the routing line and the signal post;

wherein the semiconductor device is mounted on the cap, overlaps the thermal post, does not overlap the signal post, is electrically connected to the pad and thereby electrically connected to the terminal, and is thermally connected to the cap and thereby thermally connected to the base;

wherein the adhesive is mounted on and extends above the base, extends through a first gap in the first aperture between the thermal post and the substrate and through a second gap in the second aperture between the signal post and the substrate, extends across the dielectric layer in the gaps, contacts the thermal post and the dielectric layer in the first gap, contacts the signal post and the dielectric layer in the second gap, contacts the base, the terminal and the dielectric layer outside the gaps, is sandwiched between the thermal post and the dielectric layer, between the signal post and the dielectric layer and between the base and the dielectric layer, covers and surrounds the posts in the lateral directions, extends laterally from the thermal post to or beyond the terminal and extends to peripheral edges of the assembly;

wherein the pad extends above the posts, the adhesive and the dielectric layer; and wherein the thermal post fills and is contained within the first opening and extends through the first aperture, the signal post fills and is contained within the second opening and extends through the second aperture, the thermal post and the adhesive in combination fill the first aperture, the signal post and the adhesive in combination fill the second aperture, the cap contacts and overlaps the adhesive, the routing line contacts and overlaps the adhesive and the dielectric layer, the posts have the same thickness and are coplanar with one another and with the adhesive between top and bottom surfaces of the pad and are a metal, the base and the terminal have the same thickness and are coplanar with one another and extend below the posts, the adhesive and the dielectric layer and are the same metallic material and are primarily the metal, and the base extends below the semiconductor device and the pad.

47. The assembly of claim 46, wherein the semiconductor device is a semiconductor chip, is mounted on the cap using a die attach, is electrically connected to the pad using a wire bond and is thermally connected to the cap using the die attach.

48. The assembly of claim 46, wherein the thermal post has a diameter that decreases as it extends upwardly from the base to the cap, and the signal post has a diameter that decreases as it extends upwardly from the terminal to the routing line.

49. The assembly of claim 46, wherein the cap contacts the substrate.

50. The assembly of claim 46, wherein the cap is coplanar with the pad above the posts, the adhesive and the dielectric layer and has a different thickness than the pad where the cap is adjacent to the thermal post.

51. A semiconductor chip assembly, comprising:
a semiconductor device;
an adhesive that includes first and second openings;
a heat spreader that includes a thermal post and a base, wherein the thermal post is adjacent to and integral with the base and extends above the base in an upward direction, and the base extends below the thermal post in a downward direction opposite the upward direction, covers the thermal post in the downward direction and extends laterally from the thermal post in lateral directions orthogonal to the upward and downward directions; and
a conductive trace that includes a pad, a terminal and a signal post, wherein the signal post is adjacent to and integral with the terminal and extends below the pad and above the terminal, the terminal extends laterally from the signal post and an electrically conductive path between the pad and the terminal includes the signal post;

wherein the semiconductor device is mounted on the heat spreader, overlaps the thermal post, is electrically connected to the pad and thereby electrically connected to the terminal, and is thermally connected to the thermal post and thereby thermally connected to the base;

wherein the adhesive is mounted on and extends above the base, contacts the posts, the base, and the terminal and extends laterally from the thermal post to or beyond the terminal;

wherein the pad extends above the posts and the adhesive and the terminal extends below the posts and the adhesive; and wherein the thermal post fills and is contained within the first opening, the signal post fills and is contained within the second opening, the posts have the same thickness and are coplanar with one another and with the adhesive between top and bottom surfaces of the pad and are a metal, the base and the terminal have the same thickness and are coplanar with one another below the posts and the adhesive and are the same metallic material and include the metal where they contact the adhesive, and the base extends below the semiconductor device and the pad.

52. The assembly of claim 51, wherein the adhesive covers and surrounds the posts in the lateral directions, conformally coats sidewalls of the posts and extends to peripheral edges of the assembly.

53. The assembly of claim 51, wherein the adhesive is a solidified prepreg.

54. The assembly of claim 51, wherein the thermal post extends into and above and below a first aperture in a dielectric layer, the signal post extends into and above and below a second aperture in the dielectric layer, the thermal post and the adhesive in combination fill the first aperture, the signal post and the adhesive in combination fill the second aperture and the dielectric layer contacts and is sandwiched between the adhesive and the pad and is spaced from the posts, the base and the terminal.

55. The assembly of claim 51, wherein the thermal post has a diameter that decreases as it extends upwardly from the base to its flat top, and the signal post has a diameter that decreases as it extends upwardly from the terminal to its flat top.

56. The assembly of claim 51, wherein the posts are copper and the base, the pad and the terminal are primarily copper.

57. The assembly of claim 51, wherein the heat spreader includes a cap that is adjacent to and covers in the upward direction and extends laterally in the lateral directions from a top of the thermal post and the cap contacts and overlaps the adhesive.

58. The assembly of claim 57, wherein the cap is coplanar with the pad above the posts and the adhesive and has a different thickness than the pad where the cap is adjacent to the thermal post.

59. The assembly of claim 57, wherein the posts, the base, the cap, the pad and the terminal include copper.

60. The assembly of claim 59, wherein the posts are copper, the base, the cap, the pad and the terminal consist of copper and a plated contact that provides a surface finish on the copper and the cap is copper where it is adjacent to the thermal post.

* * * * *